United States Patent
Lee et al.

(10) Patent No.: US 9,767,922 B2
(45) Date of Patent: Sep. 19, 2017

(54) MEMORY DEVICE AND MEMORY SYSTEM HAVING REPAIR UNIT MODIFICATION FUNCTION

(71) Applicant: Samsung Electronics Co., Ltd., Suwon-si (KR)

(72) Inventors: Kwang-won Lee, Hwaseong-si (KR); Chang-soo Lee, Suwon-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/237,731

(22) Filed: Aug. 16, 2016

(65) Prior Publication Data

US 2017/0133108 A1 May 11, 2017

(30) Foreign Application Priority Data

Nov. 11, 2015 (KR) .................. 10-2015-0158135

(51) Int. Cl.
  *G11C 29/00* (2006.01)
  *G11C 29/04* (2006.01)
  *G11C 11/408* (2006.01)

(52) U.S. Cl.
  CPC ............ *G11C 29/76* (2013.01); *G11C 11/408* (2013.01); *G11C 29/04* (2013.01)

(58) Field of Classification Search
  CPC ........ G11C 29/76; G11C 29/04; G11C 11/408
  See application file for complete search history.

(56) References Cited

U.S. PATENT DOCUMENTS

| | | | |
|---|---|---|---|
| 4,860,260 A | 8/1989 | Saito et al. | |
| 4,935,899 A | 6/1990 | Morigami | |
| 5,126,973 A | 6/1992 | Gallia et al. | |
| 5,224,073 A | 6/1993 | Nakayama | |
| 5,257,229 A | 10/1993 | McClure et al. | |
| 5,299,164 A | 3/1994 | Takeuchi et al. | |
| 5,359,560 A | 10/1994 | Suh et al. | |
| 5,377,146 A | 12/1994 | Reddy et al. | |
| 5,461,587 A | 10/1995 | Oh | |
| 5,475,648 A | 12/1995 | Fujiwara | |
| 5,970,000 A | 10/1999 | Kirihata et al. | |
| 9,111,624 B2 * | 8/2015 | Fujita .................. | G11C 11/1675 |
| 9,208,848 B2 * | 12/2015 | Miyakawa .......... | G11C 11/1659 |
| 9,455,051 B1 * | 9/2016 | Lim ....................... | G11C 7/08 |
| 2002/0176287 A1 * | 11/2002 | Hur ........................ | G11C 29/24 365/200 |
| 2009/0003046 A1 * | 1/2009 | Nirschl ............... | G11C 11/5678 365/163 |

* cited by examiner

*Primary Examiner* — Pho M Luu
(74) *Attorney, Agent, or Firm* — Muir Patent Law, PLLC

(57) ABSTRACT

Provided is a memory device including a memory cell array including a normal area in which a plurality of memory cells are arranged, and a redundancy area in which a plurality of redundancy memory cells are arranged, and a repair controller configured to control a repair operation on a defect cell from among the plurality of memory cells according to a first repair unit, and switch a repair unit from the first repair unit to a second repair unit different from the first repair unit when the repair operation based on the first repair unit is completed.

17 Claims, 24 Drawing Sheets

6a

| FRA1 | | | | | | WL |
|---|---|---|---|---|---|---|
| RA5 | RA4 | RA3 | RA2 | RA1 | RA0 | |
| 0 | 0 | 0 | 0 | 0 | X | WL0 |
| 0 | 0 | 0 | 0 | 0 | X | WL1 |
| 0 | 0 | 0 | 0 | 1 | 0 | WL2 |
| 0 | 0 | 0 | 0 | 1 | 1 | WL3 |

6b

| FRA2 | | | | | | WL |
|---|---|---|---|---|---|---|
| RA5 | RA4 | RA3 | RA2 | RA1 | RA0 | |
| 0 | 0 | 0 | 0 | X | X | WL0 |
| 0 | 0 | 0 | 0 | X | X | WL1 |
| 0 | 0 | 0 | 0 | X | X | WL2 |
| 0 | 0 | 0 | 0 | X | X | WL3 |

X: don't care

FIG. 8

8a
FRA1

| RA5 | RA4 | RA3 | RA2 | RA1 | RA0 | WL |
|---|---|---|---|---|---|---|
| 0 | 0 | 0 | 0 | 0 | X | WL0 |
| 0 | 0 | 0 | 0 | 0 | X | WL1 |
| 0 | 0 | 0 | 0 | 1 | 0 | WL2 |
| 0 | 0 | 0 | 0 | 1 | 1 | WL3 |
| 0 | 0 | 0 | 1 | 0 | 0 | WL4 |
| 0 | 0 | 0 | 1 | 0 | 1 | WL5 |
| 0 | 0 | 0 | 1 | 1 | 0 | WL6 |
| 0 | 0 | 0 | 1 | 1 | 1 | WL7 |

⇩

8b
FRA2

| RA5 | RA4 | RA3 | RA2 | RA1 | RA0 | WL |
|---|---|---|---|---|---|---|
| 0 | 0 | 0 | X | X | X | WL0 |
| 0 | 0 | 0 | X | X | X | WL1 |
| 0 | 0 | 0 | X | X | X | WL2 |
| 0 | 0 | 0 | X | X | X | WL3 |
| 0 | 0 | 0 | X | X | X | WL4 |
| 0 | 0 | 0 | X | X | X | WL5 |
| 0 | 0 | 0 | X | X | X | WL6 |
| 0 | 0 | 0 | X | X | X | WL7 |

X: don't care

15a

| FCA1 | | | | | | BL |
|---|---|---|---|---|---|---|
| CA5 | CA4 | CA3 | CA2 | CA1 | CA0 | |
| 0 | 0 | 0 | 0 | 0 | X | BL0 |
| 0 | 0 | 0 | 0 | 0 | X | BL1 |
| 0 | 0 | 0 | 0 | 1 | 0 | BL2 |
| 0 | 0 | 0 | 0 | 1 | 1 | BL3 |

15b

| FCA2 | | | | | | BL |
|---|---|---|---|---|---|---|
| CA5 | CA4 | CA3 | CA2 | CA1 | CA0 | |
| 0 | 0 | 0 | 0 | X | X | BL0 |
| 0 | 0 | 0 | 0 | X | X | BL1 |
| 0 | 0 | 0 | 0 | X | X | BL2 |
| 0 | 0 | 0 | 0 | X | X | BL3 |

X: don't care

US 9,767,922 B2

MEMORY DEVICE AND MEMORY SYSTEM HAVING REPAIR UNIT MODIFICATION FUNCTION

CROSS-REFERENCE TO RELATED APPLICATION

This application claims the benefit of under 35 U.S.C. §119 to Korean Patent Application No. 10-2015-0158135, filed on Nov. 11, 2015, in the Korean Intellectual Property Office, the disclosure of which is incorporated herein in its entirety by reference.

BACKGROUND

The present disclosure relates to a memory device, and more particularly, to a memory device and a memory system having a repair unit modification function.

Semiconductor chips are manufactured through semiconductor manufacturing processes, and then tested by a test device in a wafer, a die, or a package state. Defective portions or defective chips are selected through a test, and if some of memory cells are defective, repairs are performed to save semiconductor chips. Currently, semiconductor chips such as dynamic random access memories (DRAMs) have been continued to be reduced in size through fine processes, and accordingly, possibility of occurring errors during manufacturing processes have increased. Also, if defects are not detected through an initial test process, errors may occur during chip operations. To address the above problems, various test methods and apparatuses have been developed.

SUMMARY

Some exemplary embodiments of the present disclosure provide a memory device including: a memory cell array including a normal area in which a plurality of memory cells are arranged, and a redundancy area in which a plurality of redundancy memory cells are arranged; and a repair controller configured to control a repair operation on a defect cell from among the plurality of memory cells according to a first repair unit, and switch a repair unit from the first repair unit to a second repair unit different from the first repair unit when the repair operation based on the first repair unit is completed.

According to exemplary embodiments of the present disclosure, there is provided a memory device including: a memory cell array including a normal area in which a plurality of memory cells are arranged, and a redundancy area in which a plurality of redundancy memory cells are arranged; and a repair controller configured to: receive a first mode signal transmitted from outside of the memory device; perform, when the first mode signal is deactivated, a repair operation on a defect cell from among the plurality of memory cells according to a first repair unit; and switch a repair unit from the first repair unit to a second repair unit different from the first repair unit when the first mode signal is activated and the repair operation based on the first repair unit is completed.

According to exemplary embodiments of the present disclosure, there is provided a memory device including: a memory cell array comprising a normal area in which a plurality of memory cells are arranged, and a redundancy area in which a plurality of redundancy memory cells are arranged; and a repair controller configured to receive a first mode signal transmitted from outside and perform a repair operation on a defect cell from among the plurality of memory cells according to a first repair unit when the first mode signal is deactivated, and switch a repair unit from the first repair unit to a second repair unit different from the first repair unit when both the repair operation based on the first repair unit is completed and the first mode signal is activated, so that a subsequent test is performed without correcting a test algorithm or changing test sequences.

BRIEF DESCRIPTION OF THE DRAWINGS

Embodiments of the inventive concept will be more clearly understood from the following detailed description taken in conjunction with the accompanying drawings in which:

FIG. 8 is a diagram illustrating operations of a repair unit determiner, according to the example of FIG. 7;

DETAILED DESCRIPTION OF THE EMBODIMENTS

Figure 1:
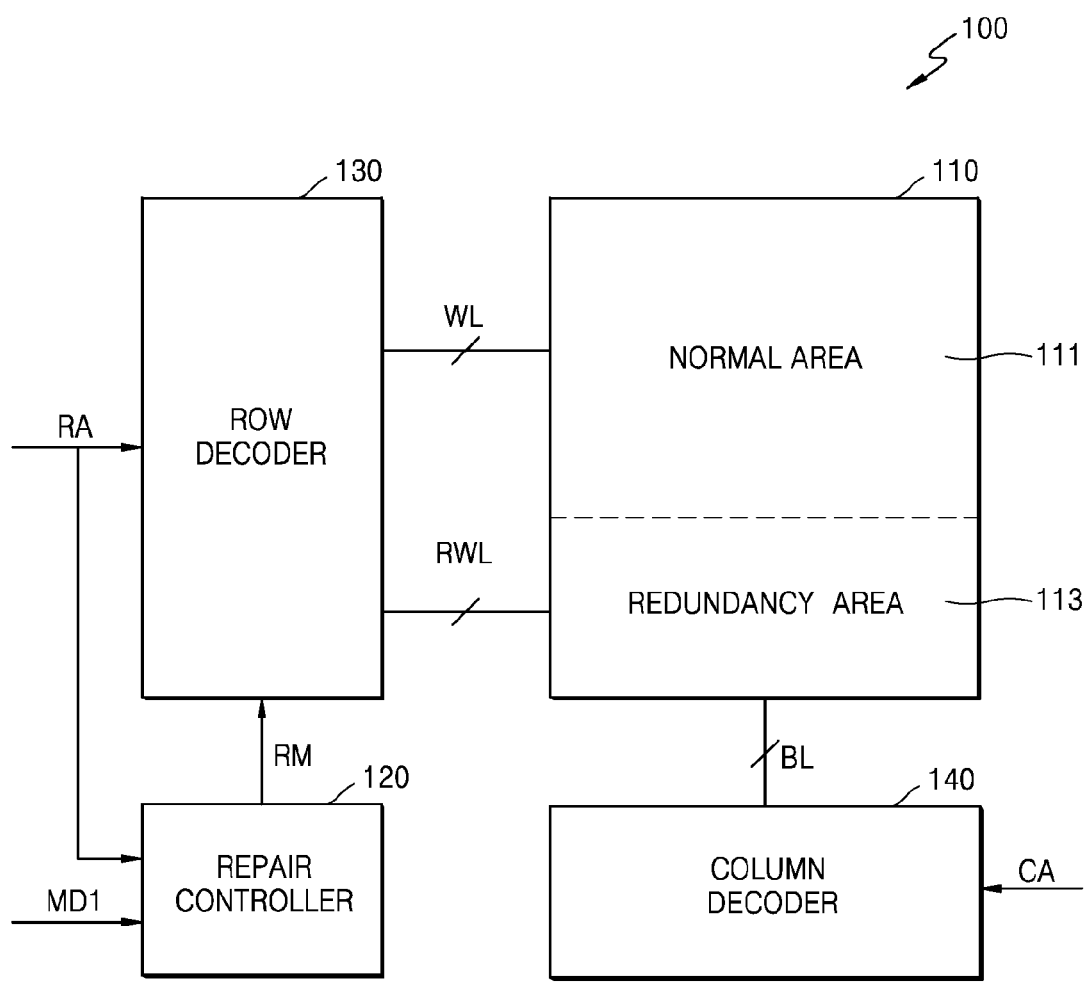
FIG. 1 is a block diagram of a memory device according to an exemplary embodiment.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Unless otherwise defined, all terms (including technical and scientific terms) used herein have the same meaning as commonly understood by one of ordinary skill in the art to which this inventive concept belongs.

A memory capacity of a memory device, e.g., a dynamic random access memory (DRAM) has been scaled up to 1 Gb, 2 Gb, 4 Gb, and 8 Gb, on a $2^i$ (i denotes the number of addresses) basis. In order to increase the memory capacity of a DRAM through a continuous scaling, a memory device that is highly integrated may be implemented, and accordingly, manufacturing processes of the DRAM may be implemented to reduce component size in memory devices. As miniaturization of the DRAM manufacturing processes continues, an occurrence ratio of memory cells having defective cells, e.g., hard or soft defective cells, may increase. A hard defective cell denotes a memory cell having a permanent defect, and a soft defective cell denotes a memory cell that is temporarily defective because of a minor defect.

As a method of repairing defective cells in order to ensure a full-memory capacity of a DRAM, a repairing method that replaces defective cells with spare cells or redundancy cells that are separately provided from normal cells has been adopted. For example, a row including a defective cell may be replaced with a spare row or a redundancy row (row repair), or a column including a defective cell may be replaced with a spare column or a redundancy column (column repair).

Hereinafter, an example in which a memory device including a repair circuit according to an embodiment includes a DRAM will be described for convenience of description. However, the memory device according to the disclosed embodiments is not limited to the DRAM, but may include various memories of different types that may be provided as semiconductor integrated circuits in a computer or other electronic devices, such as a RAM, a read only memory (ROM), a synchronous DRAM (SDRAM), a NAND flash memory and a NOR flash memory, a phase change RAM (PRAM), a magnetic RAM (MRAM), resistive RAM (ReRAM), and a ferroelectric RAM (FRAM).

FIG. 1 is a block diagram of a memory device 100 according to an exemplary embodiment.

Referring to FIG. 1, the memory device 100 may include a memory cell array 110, a repair controller 120, a row decoder 130, and a column decoder 140. However, a configuration of the memory device 100 is not limited thereto. For example, the memory device 100 may further include a page buffer that temporarily stores data to be stored in the memory cell array 110 or data read from the memory cell array 110, a data input/output circuit transmitting/receiving data stored in the page buffer to/from outside (e.g., to/from outside the memory device), or a controller receiving a command from outside (e.g., to/from outside the memory device) to control overall operations of the memory device 100 according to the command.

As used herein, a memory device may refer to a semiconductor device which may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

The memory cell array 110 may include a normal area 111 in which a plurality of memory cells are arranged and a redundancy area 113 in which a plurality of redundancy memory cells (also described as redundant memory cells) are arranged. In one embodiment, the redundancy area 113 may be disposed adjacent to the normal area 111 according to a direction in which bit lines BL extend. In more detail, the normal area 111 includes a plurality of memory cells that are respectively arranged on regions where a plurality of word lines WL and a plurality of bit lines BL cross each other, and the redundancy area 113 may include a plurality of redundancy memory cells that are respectively arranged on regions where a plurality of redundancy word lines RWL and the plurality of bit lines BL cross each other.

At least one of the plurality of memory cells arranged in the normal area 111 may have a defect, and a defective cell in which a defect has occurred may be referred to as a single bit, a weak cell, or a defect cell. The defect cell in the normal area 111 may be replaced with a redundancy memory cell included in the redundancy area 113, and the above operation may be referred to as a "repair operation". Data (e.g., predetermined data) that is to be written on or read from the defect cell may be written to or read from the redundancy memory cell, according to the repair operation.

In some embodiments, the repair operation may be performed according to a row repair method, in which a row including the defect cell of the normal area 111 is replaced with a redundancy row of the redundancy area 113. In one embodiment, a repairing unit may be a word line (e.g., a single word line), and accordingly, a word line including the defect cell may be replaced with a redundancy word line. In one embodiment, a repairing unit may be a word line group, and accordingly, a word line group including the defect cell may be replaced with a redundancy word line group. For example, a word line group may correspond to two, four, eight, or sixteen word lines, but is not limited thereto. If the repairing unit is two word lines, two word lines including the defect cell included in the normal area 111 may be replaced with two redundancy word lines included in the redundancy area 113. If the repairing unit is four word lines, four word lines including the defect cell of the normal area 111 may be replaced with four redundancy word lines included in the redundancy area 113. If the repairing unit is eight word lines, eight word lines including the defect cell included in the normal area 111 may be replaced with eight redundancy word lines included in the redundancy area 113. If the repairing unit is sixteen word lines, sixteen word lines including the defect cell included in the normal area 111 may be replaced with sixteen redundancy word lines included in the redundancy area 113.

In some exemplary embodiments, the repair controller 120 may control the repair operation on the defect cell from among the plurality of memory cells, according to a first repair unit. In more detail, when an input address of a memory cell that is to be accessed, for example, a row address RA, corresponds to a defect cell, the repair controller 120 may control the repair operation according to the first repair unit. For example, when the row address RA corresponds to the defect cell, the repair controller 120 may generate a row matching signal RM and may provide the row matching signal RM to the row decoder 130. Accordingly, the row decoder 130 may activate redundancy word lines RWL according to the first repair unit, in response to the row matching signal RM.

In some embodiments, the repair controller 120 may switch the repair unit from the first repair unit to a second repair unit, when the repair operation is finished. In one embodiment, the repair controller 120 may switch the first repair unit to the second repair unit in response to a first mode signal MD1 transmitted from outside. For example, the first repair unit may be n word lines, wherein n may be a natural number (e.g., a positive integer) and the second repair unit may be m word lines, wherein m may be a natural number (e.g., positive integer) greater than n. For example, in one embodiment, the first repair unit may be a word line (e.g., a single word line) and the second repair unit may be a word line group where a word line group may correspond to two, four, eight, or sixteen word lines, etc. In this example, the row decoder 130 may activate redundancy word lines RWL according to just the single word line (e.g., by activating only the single word line). In another embodiment, the first repair unit may be a word line group having two word lines and the second repair unit may be a word line group having more than two word lines (e.g., four, eight, sixteen, thirty-two, sixty-four, etc.). In some embodiments, the first repair unit may be a word line group having four word lines and the second repair unit may be a word line group having more than four word lines (e.g., eight, sixteen, thirty-two, sixty-four, etc.). In some embodiments, the first repair unit may be n word lines, wherein n may be a natural number (e.g., a positive integer) and the second repair unit may be m word lines, wherein m may be a natural number (e.g., positive integer) equal to n.

In some embodiments, the row decoder 130 may select some of the plurality of word lines WL in response to the row address RA, and may activate selected word lines. In some embodiments, the row decoder 130 may select some of the plurality of redundancy word lines RWL, in response to the row matching signal RM, and may activate selected redundancy word lines RWL. For example, the row decoder 130 may disable the row address RA and activate the redundancy row word lines RWL, in response to the row matching signal RM. The column decoder 140 may select some of the plurality of bit lines BL in response to a column address CA.

In some embodiments, a repair unit may be variably determined by the repair controller 120, which will be described below in detail, so that a successive test may be executed without correcting a test algorithm or changing test sequences in the successive test step, and accordingly, efficiency in performing the test may be improved. For example, even when some memory cells from the normal area 111 of the memory cell array 110 are replaced with redundancy memory cells from the redundancy area 113 of the memory cell array 110 by a repair operation (e.g., by an exemplary row repair operation mentioned above), influences of the memory cells on which the repair operation is not performed, on the memory cells on which the repair operation is performed, may be tested without correcting a test algorithm or changing test sequences in a second test step.

Figure 2:
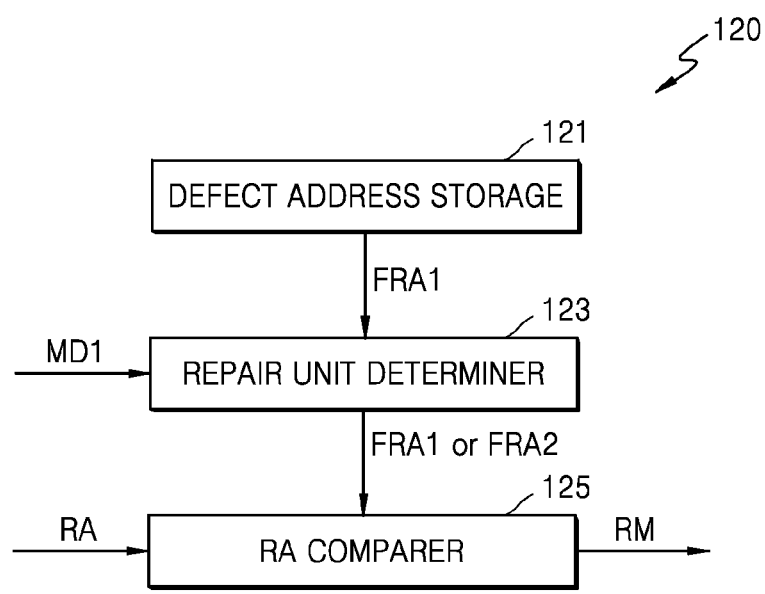
FIG. 2 is a block diagram of a repair controller of FIG. 1 according to an exemplary embodiment.

FIG. 2 is a block diagram of the repair controller 120 of FIG. 1, according to an exemplary embodiment.

Referring to FIG. 2, the repair controller 120 may include a defect address storage 121, a repair unit determiner 123 (e.g., a repair unit determiner circuit), and a row address comparer 125 (e.g., a row address comparer circuit). In FIG. 2, the defective address storage 121 is included in the repair controller 120 of the memory device 100, but is not limited thereto. The defective address storage 121 may be separately provided from the repair controller 120 in the memory device 100. In addition, the defective address storage 121 may be provided on an outer portion of the memory device 100, for example, may be included in a memory controller or a test device. Hereinafter, configurations and operations of the repair controller 120 will be described below with reference to FIGS. 1 and 2.

The defect address storage 121 may store location information, that is, address information (hereinafter, referred to as 'a first defect address'), of at least one defect cell occurring in the normal area 111 of the memory cell array 110. In one embodiment, the location information of the defect cell may be row address information of the defect cell, that is, first defect row address FRA1. Hereinafter, an example in which the defect address storage 121 stores the first defect row address FRA1 will be described below. However, one or more embodiments are not limited thereto. For example, in some embodiments, the defect address storage 121 may store column address information of the defect cell.

In an exemplary embodiment, the first defect row address FRA1 stored in the defect row address storage 121 may be updated. For example, location information of defect cells that additionally occur because the memory device 100 is continuously used may be updated in the defect address storage 121. In addition, location information of additional defect cells occurring after packaging of the memory device 100 may be also updated in the defect address storage 121. The location information of the defect cell may be obtained through a test on the memory device 100 whether to generate the defect bit. For example, the test on the memory device 100 whether to generate the defect bit may be executed on the memory device 100 of a wafer level, e.g., before packaging the memory device 100, or may be performed on the memory device 100 after packaging of the memory device 100. In one exemplary embodiment, a post package repair (PPR) may be executed by the repair controller 120. In addition, the defect address storage 121 may store location information of at least one defect redundancy memory cell occurring in the redundancy area 113 of the memory cell array 110, and the location of the defect redundancy memory cell may be updated via a test on the memory device 100. For example, the location information of the defect redundancy memory cell may be obtained through a test on the memory device 100 whether to generate the defect bit. For example, the test on the memory device 100 whether to generate the defect bit to locate the defect redundancy memory cell may be executed on the memory device 100 at a wafer level, e.g., before packaging the memory device 100, or may be performed on the memory device 100 after packaging of the memory device 100. In this exemplary embodiment, a post package repair (PPR) based on the defect redundancy memory cell may be executed by the repair controller 120.

The defect address storage 121 may include non-volatile memory devices for storing the first defect row address FRA1. For example, the defect address storage 121 may include anti-fuses AF and may store the first defect row address FRA1. However, the fuses are not limited to anti-fuses AF. For example, the defect address storage 121 may include laser fuses or electrical fuses. For convenience of explanation, the fuses are assumed to be electrical anti-fuses AF.

This will be described in more detail below with reference to FIGS. 3 and 4.

Figure 3:
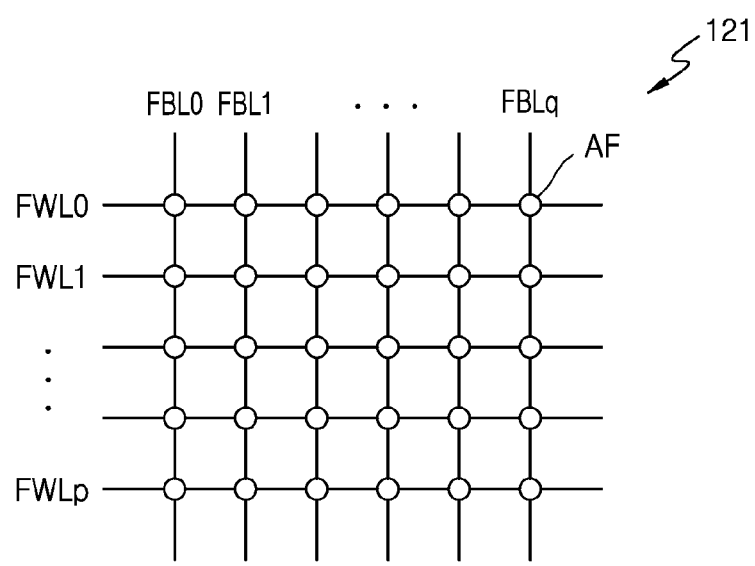
FIG. 3 is a diagram of a defective address storage, according to an exemplary embodiment.

FIG. 3 is a diagram of the defect address storage 121 according to an exemplary embodiment.

Referring to FIG. 3, the defect address storage 121 may be implemented as an anti-fuse array (e.g., anti-fuse circuit) including a plurality of anti-fuses AF that are respectively arranged on points where word lines FWL0 to FWLp and bit lines FBL0 to FBLq cross each other (In this exemplary embodiment, p and q are natural numbers greater than 2.).

As described above, since the defect address storage 121 is implemented as the anti-fuse array, information of the anti-fuses AF may be randomly accessed via driving of the word lines FWL0 to FWLp and the bit lines FBL0 to FBLq.

In addition, the defect address storage 121 may further include a controller (not shown) for programming information location of the defect cells on the anti-fuse array or for reading the location information of the defect cells from the anti-fuse array. In some embodiments, the controller may apply voltage signals of various levels to the anti-fuse array so as to switch states of the respective anti-fuses AF, and thereby storing the location information of the defect cells. In some embodiments, the controller may control the operations of the word lines FWL0 to FWLp and the bit lines FBL0 to FBLq, to which the anti-fuses AF are connected, in order to read the information stored in the anti-fuse array.

In some embodiments, the defect address storage 121 may further include a sense amplifier that senses, amplifies, and outputs the location information of the defect cells provided from the anti-fuse array. In some embodiments, the defect address storage 121 may further include a register that temporarily stores location information of the defect cells provided from the sense amplifier.

Figure 4:
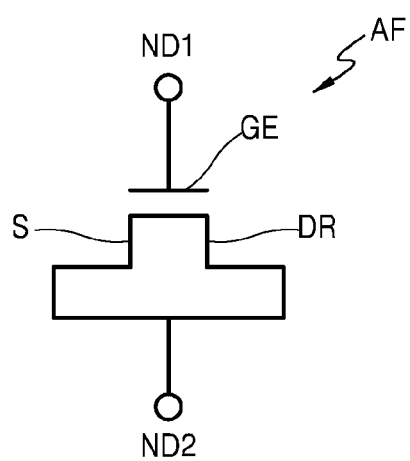
FIG. 4 is a diagram of an anti-fuse of FIG. 3 according to an exemplary embodiment.

FIG. 4 is a diagram of the anti-fuse AF of FIG. 3 according to an exemplary embodiment.

Referring to FIG. 4, the anti-fuse AF is electrically programmable, that is, the anti-fuse AF starts initially from a high-resistive state and changes to a low-resistive state according to programming operations to store the information. For example, the anti-fuse AF may include a metal-on-semiconductor (MOS) transistor of a depletion type, in which a source S and a drain DR are connected to each other. At an initial stage, a resistance between a first node ND1 connected to a gate electrode GE and a second node ND2 commonly connected to the source S and the drain DR may be very high since the first and second nodes ND1 and ND2 are separate from each other by a gate oxide layer. Accordingly, the first node ND1 and the second node ND2 are in an open state, that is, non-conductive state.

When a breakdown voltage is applied between the first node ND1 and the second node ND2 of the anti-fuse AF, the gate oxide layer may break, and accordingly, a portion between the first node ND1 and the second node ND2 may be irreversibly switched from the open state to a short-circuit state (or a state having a very low resistance value). For example, since the gate oxide layer breaks, a resistance value between the first node ND1 and the second node ND2 may be lowered.

The anti-fuse AF may be set a state when the resistance between the first node ND1 and the second node ND2 is large, to be a state programmed as logic "0", for example. Also, the anti-fuse AF may set a state when the resistance between the first node ND1 and the second node ND2 is small, to be a state programmed as logic "1", for example. In addition, the defect address storage 121 may include a non-volatile memory cell such as a flash memory, an MRAM, a ReRAM, an FRAM, or a PCM that is re-writable, instead of including the anti-fuse AF.

Referring back to FIG. 2, the repair unit determiner 123 may determine a repair unit as the first repair unit or the second repair unit, in response to the first mode signal MD1 transmitted from outside. In some embodiments, when the first mode signal MD1 is deactivated, the repair unit determiner 123 may determine the first repair unit as the repair unit and output the first defect row address FRA1. In addition, when the first mode signal MD1 is activated, the repair unit determiner 123 determines the second repair unit as the repair unit and processes some bits in the first defect row address FRA1 as don't-care bits according to the first mode signal MD1 to output a second defect row address signal FRA2. This will be described in detail below with reference to FIGS. 5 to 8.

The row address comparer 125 may compare the first defect row address FRA1 or the second defect row address FRA2 with an input row address RA. Specifically, when the first mode signal MD1 is deactivated, the row address comparer 125 compares the first defect row address FRA1 with the input row address RA. As a result of comparison, when the first defect row address FRA1 and the input row address RA are equal to each other, the row address comparer 125 may output a row matching signal RM. When the first mode signal MD1 is activated, the row address comparer 125 compares the second defect row address FRA2 with the input row address RA. As a result of comparison, when the second defect row address FRA2 and the input row address RA are equal to each other, the row address comparer 125 may output a row matching signal RM.

Figure 5:
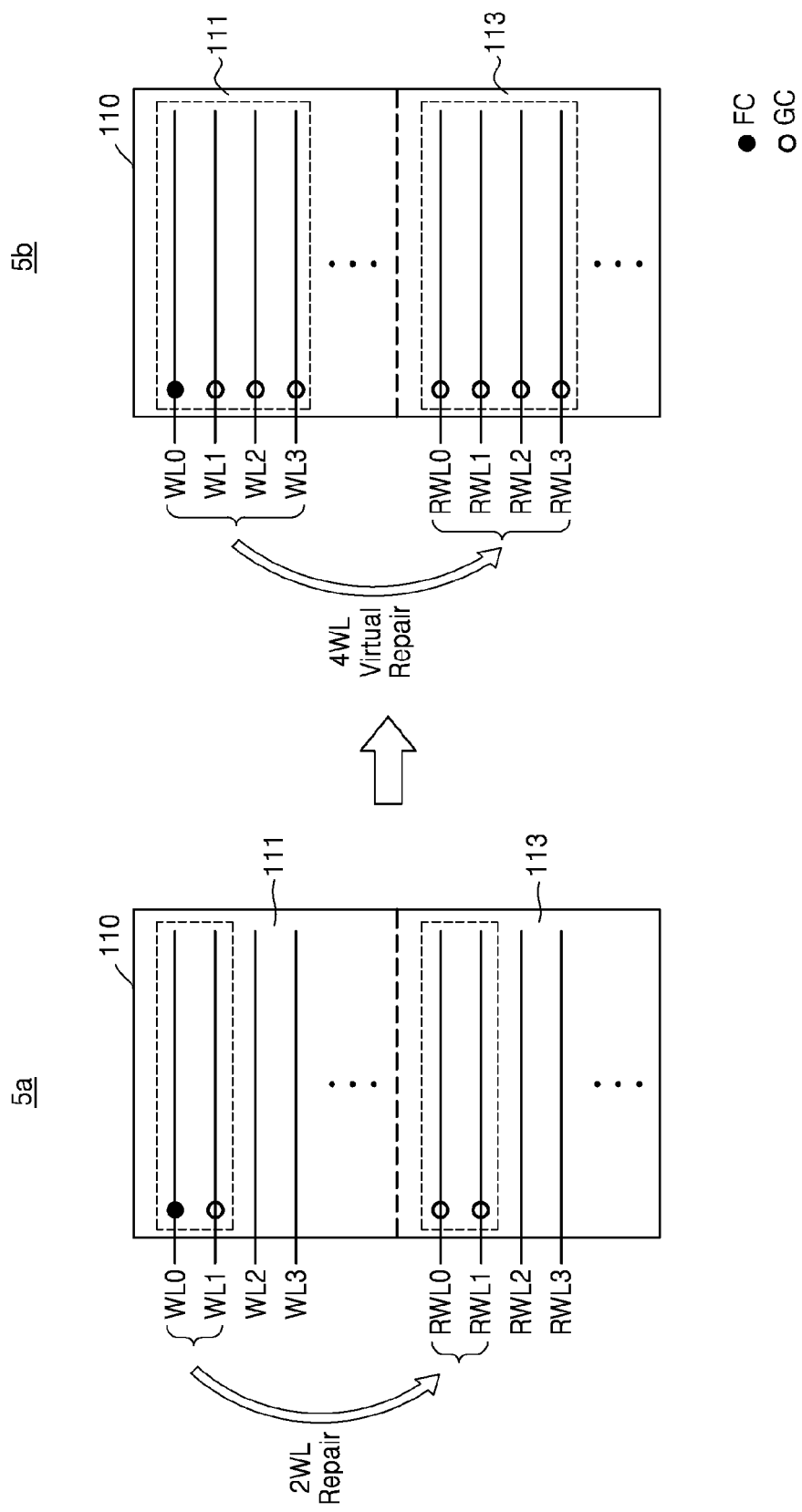
FIG. 5 is a diagram illustrating an example of a repair unit modification, according to an exemplary embodiment.

FIG. 5 shows an example of switching the repair unit, according to an embodiment.

Referring to FIG. 5, reference numeral '5a' denotes an example of a repair operation according to the first repair unit, based on a first test result, and reference numeral '5b' denotes an example of a virtual repair operation according to the second repair unit in a second test operation. For example, the first repair unit may be two word lines, and the second repair unit may be four word lines. Hereinafter, the operation of switching the repair unit will be described below with reference to FIGS. 2 and 5.

When a defect cell FC occurs in the normal area 111 during a first test step, a first word line WL0 in which the defect cell FC is arranged and a second word line WL1 adjacent to the first word line WL0 in the normal area 111 may be replaced with first and second redundancy word lines RWL0 and RWL1 of the redundancy area 113. In this exemplary embodiment, the first mode signal MD1 may be deactivated. With reference to FIG. 5, 'GC' may refer to a good cell that is not defective.

For example, if a test is performed on an effect to the second word line WL1 by enabling a third word line WL2 during the second test step, the second test may not be executed exactly because the second word line WL1 is being replaced with the second redundancy word line RWL1 by the repair operation. Therefore, a test algorithm for performing the second test has to be corrected or a test sequence has to be changed.

However, according to an exemplary embodiment, the first mode signal MD1 may be activated during the second test step, and accordingly, the repair unit may be switched to the second repair unit. According to the second repair unit, first to fourth word lines WL0 to WL3 of the normal area 111 may be regarded to be replaced with first to fourth redundancy word lines RWL0 to RWL3 of the redundancy area 113 by a virtual repair operation. In this exemplary embodiment, the third redundancy word line RWL2 may be enabled during the second test step so as to perform a test on influence to the second redundancy word line RWL1. Therefore, the second test may be executed without correcting the test algorithm or changing the test sequence for performing the second test.

Figure 6:
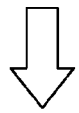
FIG. 6 is a diagram illustrating operations of a repair unit determiner according to the example of FIG. 5.

FIG. 6 illustrates an operation of the repair unit determiner 123 according to the example of FIG. 5.

Referring to FIG. 6, reference numeral '6a' denotes outputs of the repair unit determiner 123 when the first mode signal MD1 is deactivated, and reference numeral '6b' denotes outputs of the repair unit determiner 123 when the first mode signal MD1 is activated. For example, the first repair unit may be two word lines and the second repair unit may be four word lines. Hereinafter, operations of the repair unit determiner 123 will be described below with reference to FIGS. 2, 5, and 6.

When the first mode signal MD1 is deactivated, the repair unit determiner 123 determines the first repair unit as the repair unit, and outputs the first defect row address FRA1. In this exemplary embodiment, the first defect row address FRA1 may be generated by processing the least significant bit of the row address, e.g., RA0 as a don't-care bit, and accordingly, the first and second word lines WL0 and WL1 may correspond to the defect row. Therefore, as shown in '5a' of FIG. 5, the first and second word lines WL0 and WL1 may be replaced with the first and second redundancy word lines RWL0 and RWL1.

When the first mode signal MD1 is activated, the repair unit determiner 123 determines the second repair unit as the repair unit, and outputs the second defect row address FRA2. In this exemplary embodiment, the second defect row address FRA2 may be generated by processing the least significant bit of the row address, e.g., RA0, and the second least significant bit, e.g., RA1 as don't-care bits. Accordingly, the first to fourth word lines WL0 to WL3 may correspond to the defect row. Therefore, as exemplarily shown in '5b' of FIG. 5, it may be regarded that the first to fourth word lines WL0 to WL3 are replaced with the first to fourth redundancy word lines RWL0 to RWL3.

Figure 7:
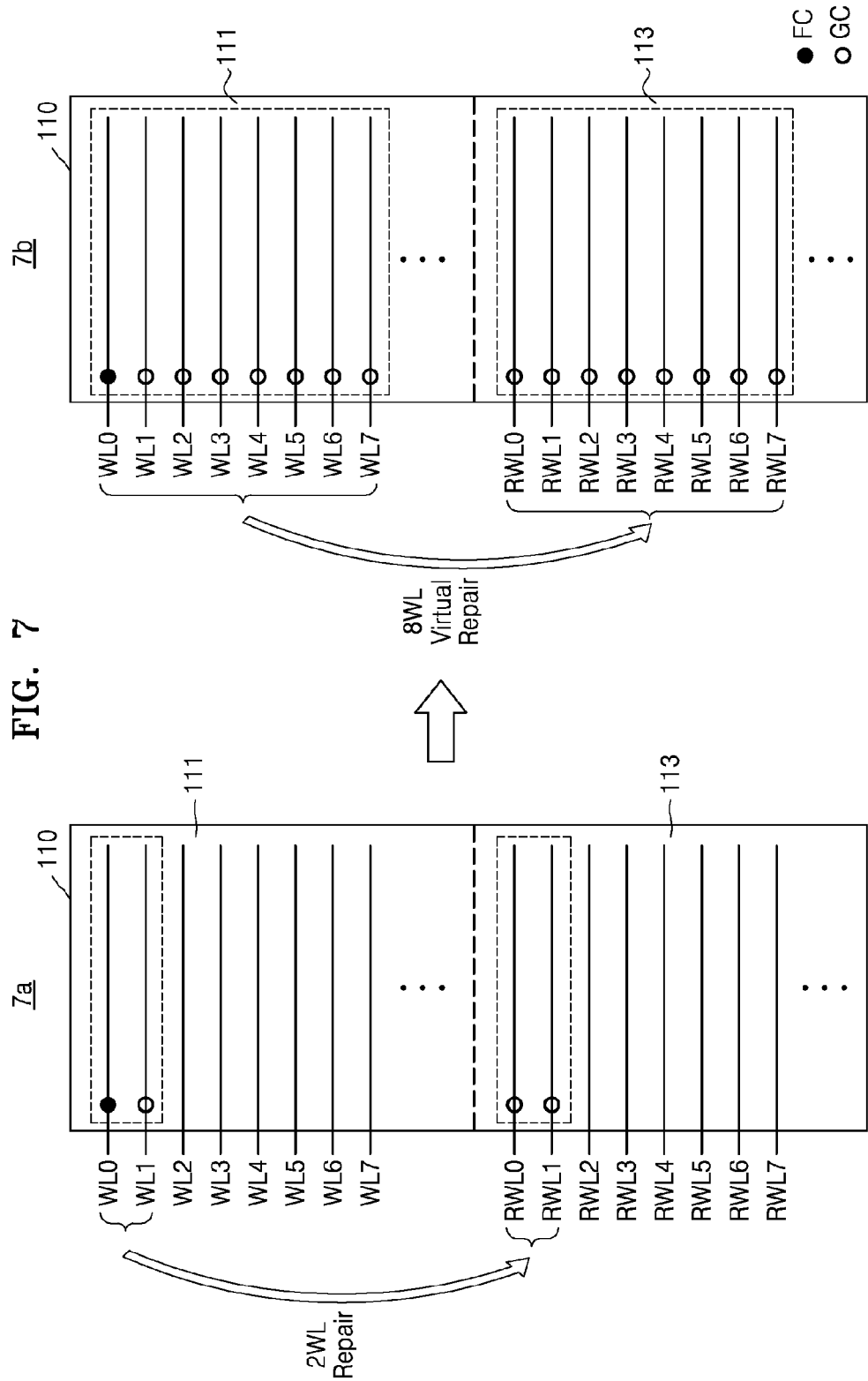
FIG. 7 is a diagram illustrating another example of a repair unit modification, according to an exemplary embodiment.

FIG. 7 illustrates another example of a repair unit shift, according to an exemplary embodiment.

Referring to FIG. 7, reference numeral '7a' illustrates an example of the repair operation according to the first repair unit, based on a first test result, and reference numeral '7b' denotes an example of a virtual repair operation according to the second repair unit in the second test step. For example, the first repair unit may be two word lines and the second repair unit may be eight word lines. Hereinafter, the repair unit switching operation will be described below with reference to FIGS. 2 and 7.

When a defect cell FC occurs in the normal area 111 during the first test step, the first word line WL0 in which the defect cell FC is disposed and the second word line WL1 adjacent to the first word line WL0 of the normal area 111 may be replaced with the first and second redundancy word lines RWL0 and RWL1 of the redundancy area 113, according to the first repair unit. In this exemplary embodiment, the first mode signal MD1 may be deactivated.

For example, when the third word line WL2 is enabled to perform a test on influence to the second word line WL1 during the second test step, the second test may not be performed accurately because the second word line WL1 is replaced with the second redundancy word line RWL1 in the repair operation. Therefore, a test algorithm for performing the second test has to be corrected or a test sequence has to be changed.

However, according to an exemplary embodiment, the first mode signal MD1 may be activated in the second test step, and accordingly, the repair unit may be switched to the second repair unit. According to the second repair unit, it may be regarded that first to eighth word lines WL0 to WL7 of the normal area 111 are replaced with first to eighth redundancy word lines RWL0 to RWL7 of the redundancy area 113 due to a virtual repair operation. In this exemplary embodiment, the third redundancy word line RWL2 may be enabled to perform a test on influence to the second redundancy word line RWL1 during the second test step. Therefore, the second test may be performed without correcting the test algorithm for the second test or changing the test sequence of the second test.

FIG. 8 illustrates operations of the repair unit determiner 123 according to the example illustrated in FIG. 7.

Referring to FIG. 8, reference numeral '8a' denotes outputs of the repair unit determiner 123 when the first mode signal MD1 is deactivated, and reference numeral '8b' denotes outputs of the repair unit determiner 123 when the first mode signal MD1 is activated. For example, the first repair unit may be two word lines, and the second repair unit may be eight word lines. Hereinafter, operations of the repair unit determiner 123 will be described below with reference to FIGS. 2, 7, and 8.

The repair unit determiner 123 determines the first repair unit as the repair unit when the first mode signal MD1 is deactivated, and then, outputs the first defect row address FRA1. In this exemplary embodiment, the first defect row address FRA1 may be generated by processing the least significant bit of the row address, e.g., RA0 as a don't-care bit, and accordingly, the first and second word lines WL0 and WL1 may correspond to the defect row. Therefore, as exemplarily shown in '7a' of FIG. 7, the first and second word lines WL0 and WL1 may be replaced with the first and second redundancy word lines RWL0 and RWL1.

When the first mode signal MD1 is activated, the repair unit determiner 123 may determine the second repair unit as the repair unit, and output the second defect row address FRA2. In this exemplary embodiment, the second defect row address FRA2 may be generated by processing the least significant bit of the row address, e.g., RA0, and a second least significant bit, e.g., RA1, and a third least significant bit, e.g., RA2 as don't-care bits, and accordingly, the first to eighth word lines WL0 to WL7 may correspond to the defect row. Therefore, as exemplarily shown in '7b' of FIG. 7, it may be regarded that the first to eight word lines WL0 to WL7 are replaced with the first to eighth redundancy word lines RWL0 to RWL7.

As described above with reference to FIGS. 5 to 8, when a defect cell occurs as a result of the first test, the repair operation is performed on the defect cell according to the first repair unit, and when the repair operation is finished, the repair unit may be switched from the first repair unit to the second repair unit. As described above, according to the embodiment, by variably determining the repair unit, a successive test may be performed without correcting the test algorithm or changing the test sequence in the successive test step, and accordingly, test efficiency may be improved. In more detail, according to one embodiment, even when some rows are replaced with redundancy rows by the repair operation, influences of the rows that are not repaired during the repair operation on the rows that have been repaired by the repair operation may be tested without correcting the test algorithm or changing the test sequence in a second test step.

Figure 9:
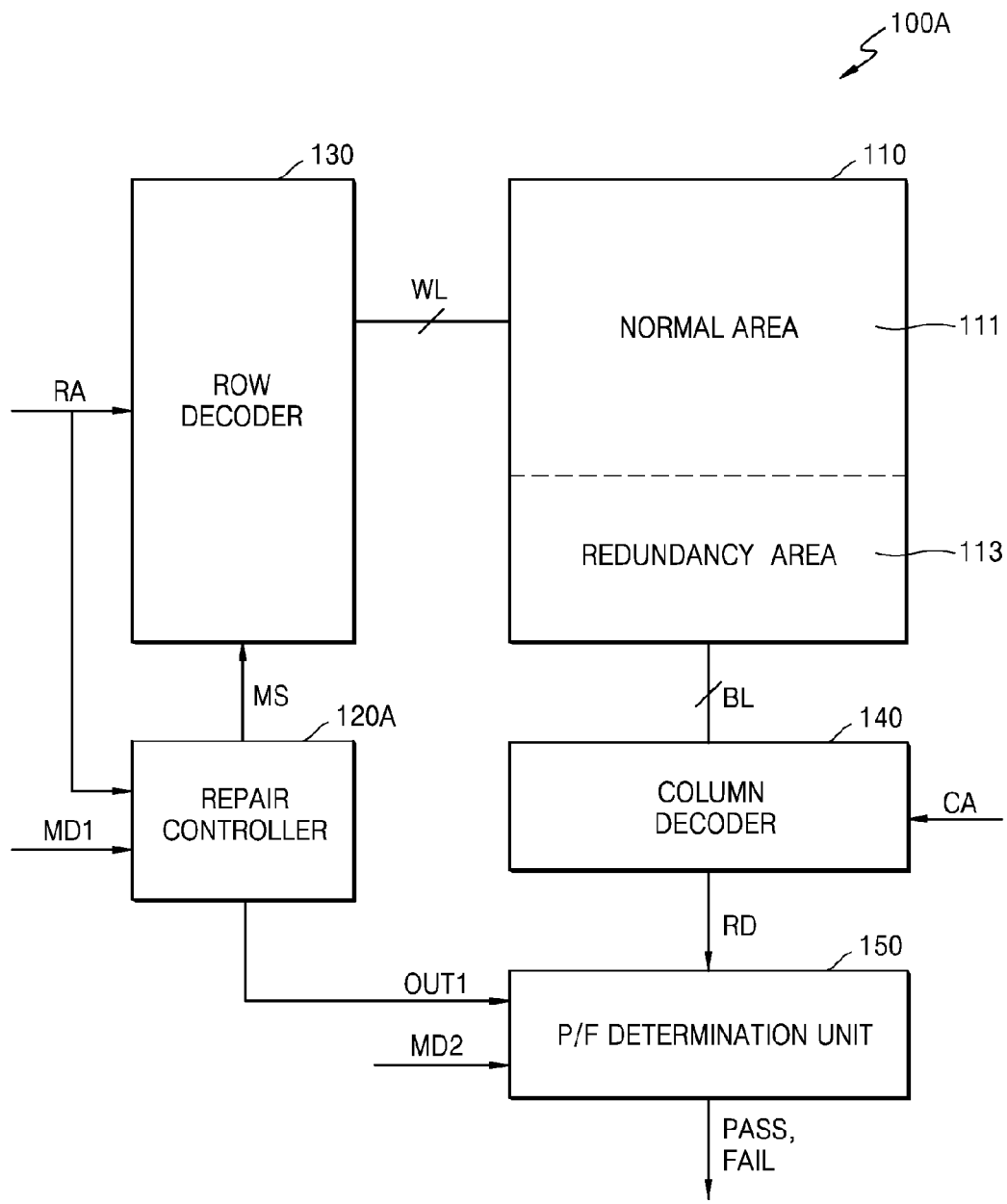
FIG. 9 is a block diagram of a memory device according to an exemplary embodiment.

FIG. 9 is a block diagram of a memory device 100A according to an exemplary embodiment.

Referring to FIG. 9, the memory device 100A may include the memory cell array 110, a repair controller 120A, the row decoder 130, the column decoder 140, and a pass/fail determiner 150 (e.g., a pass/fail determiner circuit). The memory device 100A according to the embodiment is modified from the memory device 100 of FIG. 1, and the memory device 100A may further include the pass/fail determiner 150 when comparing with the memory device 100 of FIG. 1. Descriptions above with reference to FIGS. 1 to 8 may be applied to the memory device 100A of the embodiment, and overlapping descriptions are not provided.

The repair controller 120A may control a repair operation performed on defect cells from among a plurality of memory cells, according to a first repair unit, and when the repair operation is finished, the repair controller 120A may switch the repair unit from the first repair unit to a second repair unit. In addition, the repair controller 120A may output a first output signal OUT1 representing information about cells that have not been repaired during the repair operation according to the repair operation, but have been virtually repaired according to the second repair unit (for example, memory cells connected to the third and fourth word lines WL3 and WL4 of FIG. 5).

The pass/fail determiner 150 determines whether the memory cell array 110 has passed the test and outputs a pass signal PASS or a fail signal FAIL, based on the first output signal OUT1 transmitted from the repair controller 120A and a second mode signal MD2 transmitted from outside. The second mode signal MD2 may be deactivated in the first test step and activated in the second test step. For example, the second mode signal MD2 may be transmitted from a test device or a memory controller (not shown).

When the second mode signal MD2 is deactivated, the pass/fail determiner 150 may perform a general pass/fail determination operation. In detail, the pass/fail determiner 150 compares data RD read from the memory cell array 110 with data written on the memory cell array 110, and thereby performing the general pass/fail operation on the memory cells of the memory cell array 110.

In this exemplary embodiment, when the second mode signal MD2 is activated, the pass/fail determiner 150 may perform a pass/fail determination operation according to the first output signal OUT1. In detail, the pass/fail determiner 150 may output a pass signal PASS as a default with respect to the memory cells, on which the virtual repair operation is performed according to the second repair unit, based on the first output signal OUT1. However, one or more embodiments are not limited thereto, that is, the pass/fail determiner 150 may output a fail signal FAIL as a default with respect to the memory cells, on which the virtual repair operation is performed according to the second repair unit, based on the first output signal OUT1.

For example, although the repair operation is not performed on the third and fourth word lines WL2 and WL3 of FIG. 3, it is regarded that the repair operation is performed on the third and fourth word lines WL2 and WL3 according to the second repair unit during the second test step, and then, the second test may be performed thereon. In this exemplary embodiment, the memory cells connected to the third and fourth word lines WL2 and WL3 are determined to have passed regardless of the read data RD, and then, a pass signal PASS may be output. Accordingly, errors occurring in the test on the memory cells, on which the repair operation is not performed whereas the virtual repair operation is performed, may be prevented.

Figure 10:
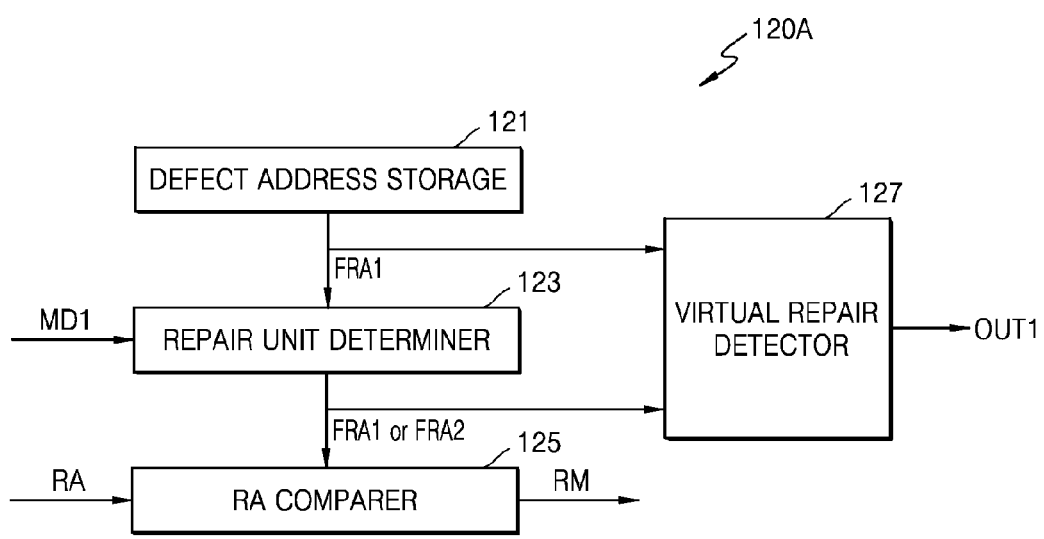
FIG. 10 is a block diagram of a repair controller of FIG. 9 according to an exemplary embodiment.

FIG. 10 is a block diagram of the repair controller 120A of FIG. 9, according to the exemplary embodiment.

Referring to FIG. 10, the repair controller 120A may include the defect address storage 121, the repair unit determiner 123, the row address comparer 125, and a virtual repair detector 127 (e.g., a virtual repair detector circuit). The repair controller 120A according to the embodiment is obtained by modifying the repair controller 120 of FIG. 2, and thus, descriptions above with reference to FIGS. 2 to 4 may be applied to the repair controller 120A of FIG. 10, and descriptions provided above are omitted here.

In one embodiment, the virtual repair detector 127 receives a first defect row address FRA1 and a second defect row address FRA2, and may compare the first defect row address FRA1 with the second defect row address FRA2. When the first defect row address FRA1 and the second defect row address FRA2 are equal to each other, the virtual repair detector 127 generates a first output signal OUT1 that is deactivated, and when the first defect row address FRA1 and the second defect row address FRA2 are not equal to each other, the virtual repair detector 127 may generate a first output signal OUT1 that is activated.

When the first and second defect row addresses FRA1 and FRA2 are not equal to each other, it may be regarded that corresponding memory cells are not repaired according to the first repair unit, but are virtually repaired according to the second repair unit. In this exemplary embodiment, the first output signal OUT1 may be a virtual repair detection signal representing whether the virtual repair operation is performed on the memory cells, on which the repair operation is not performed according to the first repair unit.

However, in some other embodiments, the virtual repair detector 127 receives the second defect row address FRA2. Then, when the second defect row address FRA2 includes a don't-care bit, the virtual repair detector 127 may generate the first output signal OUT1 that is activated, and when the second defect row address FRA2 does not include a don't-care bit, the virtual repair detector 127 may generate the first output signal OUT1 that is deactivated. In this exemplary embodiment, the first output signal OUT1 may be a signal representing whether to perform the virtual repair operation.

In addition, in some embodiments, the repair controller 120A may provide the first and second defect row addresses FRA1 and FRA2 to the pass/fail determiner 150. In one embodiment, the pass/fail determiner 150 may determine whether the memory cell array 110 has passed the test, based on the first and second defect row addresses FRA1 and FRA2, and the second mode signal MD2. In one embodiment, the pass/fail determiner 150 may generate a virtual repair detection signal based on the first and second defect row addresses FRA1 and FRA2, and may determine whether the memory cell array 110 has passed the test based on the virtual repair detection signal and the second mode signal MD2.

In some embodiments, the repair controller 120A may provide the second defect row address FRA2 to the pass/fail determiner 150. For example, in one embodiment, the pass/fail determiner 150 may determine whether the memory cell array 110 has passed the test, based on the second defect row address FRA2 and the second mode signal MD2. In one embodiment, the pass/fail determiner 150 may generate a virtual repair detection signal based on the second defect row address FRA2, and may determine whether the memory cell array 110 has passed the test based on the virtual repair detection signal and the second mode signal MD2.

Figure 11:
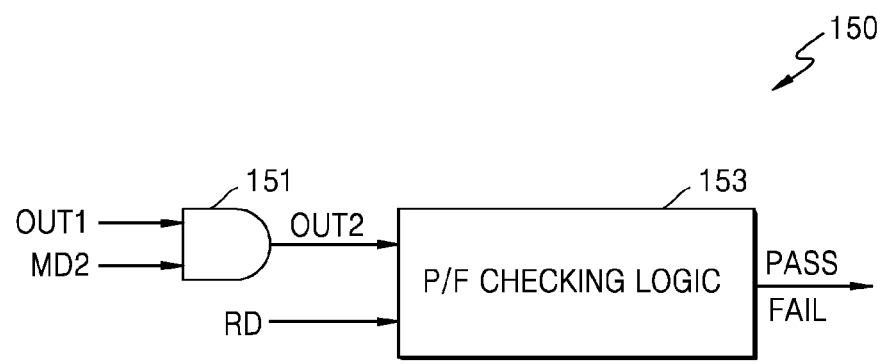
FIG. 11 is a block diagram of a pass/fail determiner of FIG. 9 according to an exemplary embodiment.

FIG. 11 is a block diagram of the pass/fail determiner 150 of FIG. 9, according to the exemplary embodiment.

Referring to FIG. 11, the pass/fail determiner 150 may include a logic gate 151 and a pass/fail check logic 153. However, a configuration of the pass/fail determiner 150 is not limited thereto. For example, the pass/fail determiner 150 may further include other components between the logic gate 151 and the pass/fail check logic 153.

The logic gate 151 performs a logical operation on the first output signal OUT1 and the second mode signal MD2 to generate a second output signal OUT2. In one embodiment, the logic gate 151 may execute a logical multiplication (AND) operation on the first output signal OUT1 and the second mode signal MD2 to generate the second output signal OUT2. However, one or more embodiments are not limited thereto, and the configuration of the logic gate 151 may vary.

The pass/fail check logic 153 may output a pass signal PASS or a fail signal FAIL with respect to the memory cell array 110, based on the read data RD transmitted from the memory cell array 110 and the second output signal OUT2 from the logic gate 151. In more detail, the pass/fail check logic 153 may be connected to the column decoder 140, and may receive the read data RD from the column decoder 140.

In one embodiment, when the second output signal OUT2 is deactivated, the pass/fail check logic 153 may perform a general pass/fail checking operation. In more detail, the pass/fail check logic 153 may compare the read data RD read from the memory cell array 110 with the data written on the memory cell array 110 to perform the general pass/fail operation on the memory cells of the memory cell array 110.

In addition, when the second output signal OUT2 is activated, the pass/fail check logic 153 ignores the read data RD from the memory cell array 110, and may perform the pass/fail check operation according to the second output signal OUT2. In detail, the pass/fail check logic 153 may output the pass signal PASS as a default when the second output signal OUT2 is activated. However, one or more embodiments are not limited thereto, and the pass/fail check logic 153 may output the fail signal FAIL as a default when the second output signal OUT2 is activated.

Figure 12:
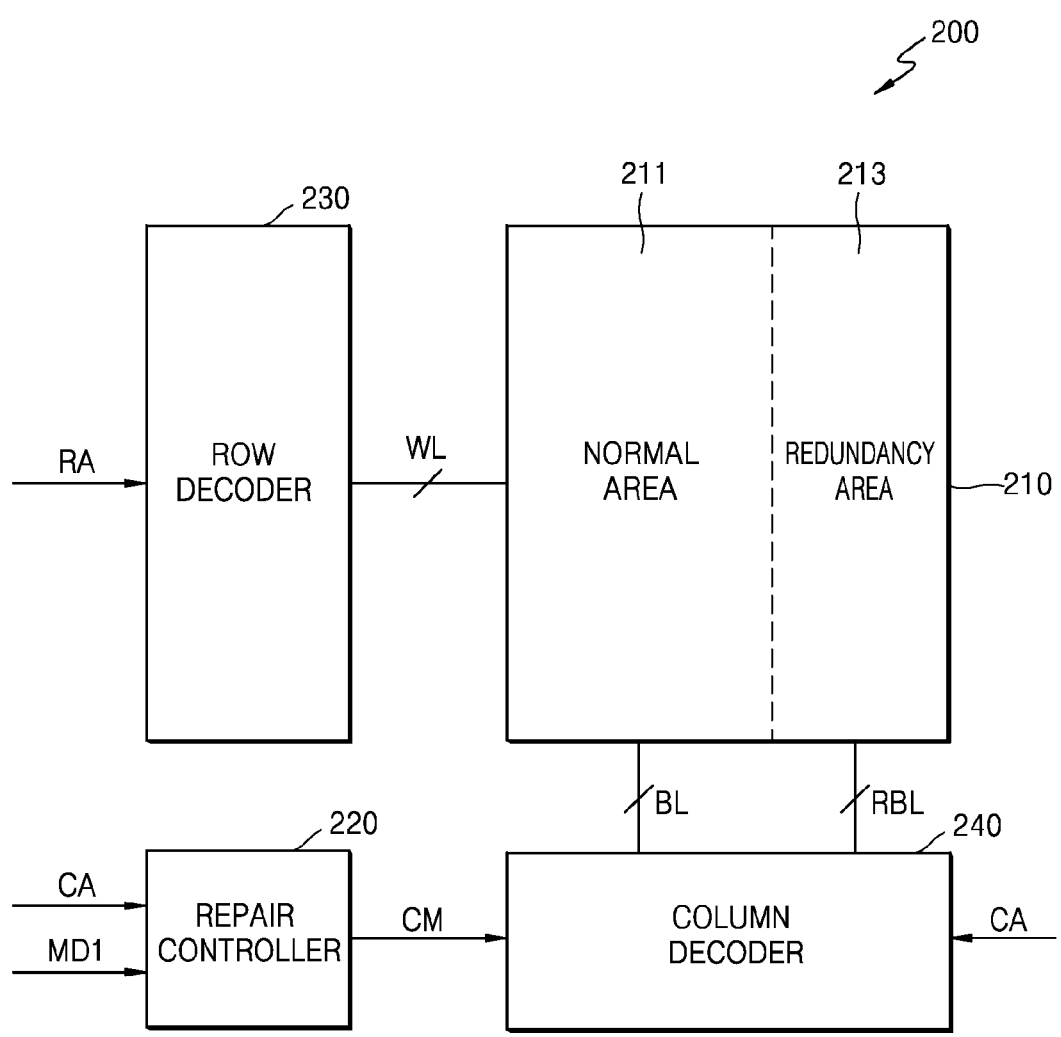
FIG. 12 is a block diagram of a memory device according to an exemplary embodiment.

FIG. 12 is a block diagram of a memory device 200 according to an exemplary embodiment.

Referring to FIG. 12, the memory device 200 may include a memory cell array 210, a repair controller 220, a row decoder 230, and a column decoder 240. The memory device 200 according to the embodiment is obtained by modifying the memory device 100 of FIG. 1, and thus, descriptions about the components same as those of the memory device 100 are omitted.

The memory cell array 210 may include a normal area 211 on which a plurality of memory cells are arranged, and a redundancy area 213 on which a plurality of redundancy memory cells are arranged. In one embodiment, the redundancy area 213 may be adjacent to the normal area 211 along a direction in which word lines WL extend. In detail, the normal area 211 may include the plurality of memory cells that are respectively disposed on regions where the plurality of word lines WL and a plurality of bit lines BL intersect each other, and the redundancy area 213 may include the plurality of redundancy memory cells that are respectively disposed on regions where the plurality of word lines WL and a plurality of redundancy bit lines RBL intersect each other.

At least one of the memory cells arranged on the normal area 211 may have a defect, and a defect cell occurring in the normal area 211 may be replaced with a redundancy memory cell included in the redundancy area 213 according to a repair operation. According to the repair operation, data that is to be written on or read from the defect cell may be written on or read from the redundancy memory cell.

In this exemplary embodiment, a column repair operation may be performed in a manner that a column including the defect cell of the normal area 211 is replaced with a redundancy column of the redundancy area 213. In one embodiment, a repair unit may be a bit line, and accordingly, a bit line including the defect cell may be replaced with a redundancy bit line. In one embodiment, the repair unit may be a bit line group, and accordingly, a bit line group including the defect cell may be replaced with a redundancy bit line group. For example, a bit line group may correspond to two, four, eight, or sixteen bit lines. If the repair unit is two bit lines, two bit lines including the defect cell of the normal area 211 may be replaced with two redundancy bit lines included in the redundancy area 213. If the repair unit is four bit lines, four bit lines including the defect cell of the normal area 211 may be replaced with four redundancy bit lines included in the redundancy area 213. If the repair unit is eight bit lines, eight bit lines including the defect cell of the normal area 211 may be replaced with eight redundancy bit lines included in the redundancy area 213. If the repair unit is sixteen bit lines, sixteen bit lines including the defect cell of the normal area 211 may be replaced with sixteen redundancy bit lines included in the redundancy area 213.

The repair controller 220 may control the repair operation on a defect cell from among the plurality of memory cells, according to a first repair unit. In detail, the repair controller 220 may control the repair operation according to the first repair unit, when an input address of the memory cell that is to be accessed, e.g., a column address CA, corresponds to the defect cell. In more detail, the repair controller 220 may generate a column matching signal CM when the column address CA corresponds to the defect cell, and may provide the column matching signal CM to the column decoder 240. Accordingly, the column decoder 240 may activate the redundancy bit lines RBL according to the first repair unit, in response to the column matching signal CM.

In addition, when the repair operation is finished, the repair controller 220 may switch the first repair unit to a second repair unit. In one embodiment, the repair controller 220 may switch the first repair unit to the second repair unit in response to the first mode signal MD1 transmitted from outside. For example, the first repair unit may be n bit lines, wherein n is a natural number. In addition, for example, the second repair unit may be m bit lines, wherein m is a natural number greater than n.

The row decoder 230 may select some of the plurality of word lines WL in response to a row address RA, and may activate selected word lines. The column decoder 240 may select some of the plurality of bit lines BL in response to the column address CA, and may activate selected bit lines. In addition, the column decoder 240 may select some of the plurality of redundancy bit lines RBL in response to the column matching signal CM, and may activate selected redundancy bit lines RBL. In detail, the column decoder 240 may disable the column address CA and activate a redundancy bit line, in response to the column matching signal CM.

Figure 13:
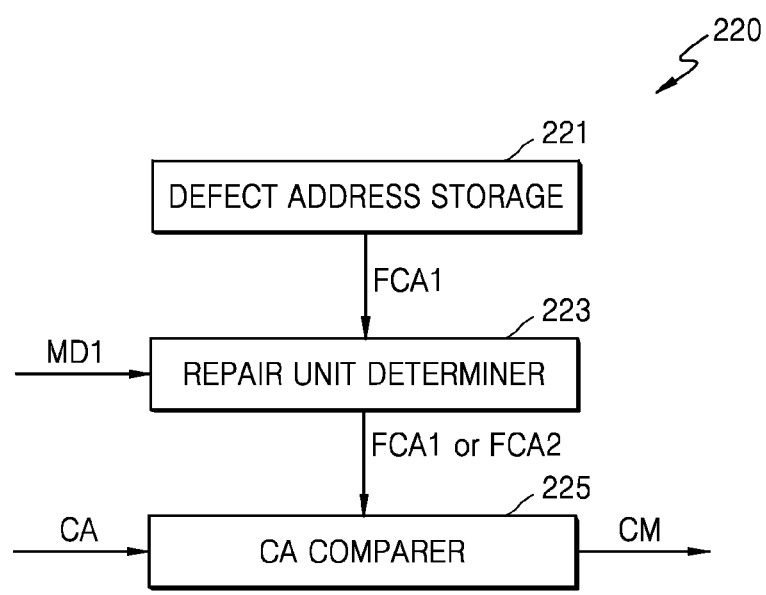
FIG. 13 is a block diagram of a repair controller of FIG. 12 according to an exemplary embodiment.

FIG. 13 is a block diagram of the repair controller 220 of FIG. 12, according to the exemplary embodiment.

Referring to FIG. 13, the repair controller 220 may include a defect address storage 221, a repair unit determiner 223, and a column address comparer 225 (e.g., a column address comparer circuit). In FIG. 13, the defect address storage 221 is included in the repair controller 220 of the memory device 200, but is not limited thereto. For example, in one embodiment, the defect address storage 221 may be provided separately from the repair controller 220 in the memory device 200. In another embodiment, the defect address storage 221 may be provided outside the memory device 200, e.g., may be included in a memory controller or a test device. Hereinafter, configuration and operations of the repair controller 220 will be described below with reference to FIGS. 12 and 13.

The defect address storage 221 stores location information of at least one defect cell occurring in the normal area 211 of the memory cell array 210, that is, address information (hereinafter, referred to as 'first defect address information'). In one embodiment, the location information of the defect cell may be column address information of the defect cell, that is, a first defect column address FCA1. Hereinafter, an example in which the defect address storage 221 stores the first defect column address FCA1 will be described below. However, one or more embodiments are not limited thereto, and the defect address storage 221 may store row address information of the defect cell.

In addition, the first defect column address FCA1 stored in the defect address storage 221 may be updated. For example, location information of defect cells that additionally occur because the memory device 200 is continuously utilized may be updated in the defect address storage 221. In addition, location information of additional defect cells occurring after packaging the memory device 200 may be updated in the defect address storage 221. The location information of the defect cells may be obtained by performing a test on the memory device 200 whether defective bits occur. This above-described test may be performed at a wafer level of the memory device 200, that is, before packaging the memory device 200, or may be performed after packaging the memory device 200. That is, the repair controller 220 may perform a post-package repair operation. In addition, the defect address storage 221 may store location information of at least one defect redundancy memory cell occurring on the redundancy area 213 of the memory cell array 210, and the location information of the defect redundancy memory cell may be also updated by performing a test on the memory device 200.

The defect address storage 221 includes non-volatile memory devices for storing the first defect column address FCA1. For example, the defect address storage 221 may include anti-fuses AF for storing the first defect column address FCA1. The above descriptions with reference to FIGS. 3 and 4 may be also applied to the embodiment illustrated in FIG. 13.

The repair unit determiner 223 may determine the first repair unit or the second repair unit as the repair unit in response to the first mode signal MD1 transmitted from outside. In more detail, when the first mode signal MD1 is deactivated, the repair unit determiner 223 may output the first defect column address FCA1, and when the first mode signal MD1 is activated, the repair unit determiner 223 processes some of the bits as don't-care bits according to the first mode signal MD1 to output a second defect column address FCA2. This will be described in more detail below with reference to FIGS. 14 and 15.

The column address comparer 225 may compare the first or second defect column address FCA1 or FCA2 with the input column address CA. In detail, when the first mode signal MD1 is deactivated, the column address comparer 225 compares the first defect column address FCA1 with the input column address CA, and when the first defect column address FCA1 is equal to the input column address CA as a comparison result, the column address comparer 225 may output a column matching signal CM. When the first mode signal MD1 is activated, the column address comparer 225 compares the second defect column address FCA2 with the input column address CA, and when the second defect column address FCA2 is equal to the input column address CA, the column address comparer 225 may output a column matching signal CM.

Figure 14:
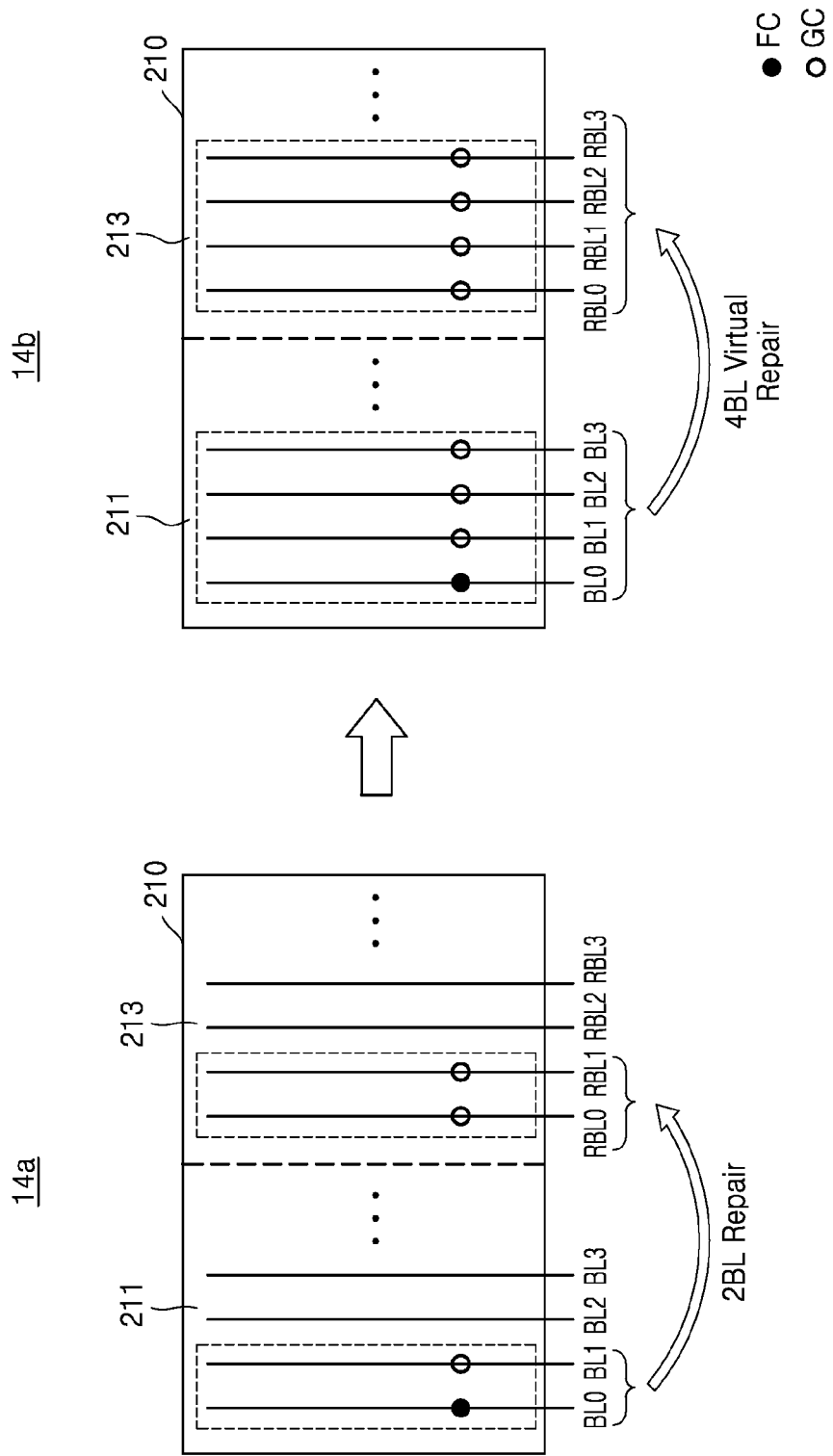
FIG. 14 is a diagram illustrating an example of a repair unit modification, according to an exemplary embodiment.

FIG. 14 illustrates an example of changing the repair unit, according to an exemplary embodiment.

Referring to FIG. 14, reference numeral '14a' denotes a repair operation according to the first repair unit based on a first test result, and reference numeral '14b' denotes a virtual repair operation according to the second repair unit in a second test step. For example, the first repair unit may two bit lines, and the second repair unit may be four bit lines. Hereinafter, the operation of changing the repair unit according to the embodiment will be described below with reference to FIGS. 13 and 14.

When a defect cell FC occurs in the normal area 211 during the first test step, a first bit line BL0 in which the defect cell FC of the normal area 211 is arranged and a second bit line BL1 adjacent to the first bit line BL0 may be replaced with first and second redundancy bit lines RBL0 and RBL1 of the redundancy area 213. In this exemplary embodiment, the first mode signal MD1 may be deactivated.

For example, when a test is performed on influence to the second bit line BL1 by enabling a third bit line BL2 during the second test step, the second test may not be performed accurately because the second bit line BL1 is replaced with the second redundancy bit line RBL1 according to the repair operation. Therefore, a test algorithm has to be corrected or test sequences of the second test have to be changed.

However, according to this exemplary embodiment, the first mode signal MD1 may be activated in the second test step, and accordingly, the repair unit may be switched to the second repair unit. According to the second repair unit, it may be regarded that first to fourth bit lines BL0 to BL3 of the normal area 211 are replaced with first to fourth redundancy bit lines RBL0 to RBL3 of the redundancy area 213. In this exemplary embodiment, the test may be performed on the influence to the second redundancy bit line RBL1 by enabling the third redundancy bit line RBL2 in the second test step. Therefore, the test algorithm for performing the second test may not be corrected or the test sequences may not be changed to perform the second test.

Figure 15:
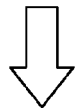
FIG. 15 is a diagram illustrating operations of a repair unit determiner according to the example of FIG. 14.

FIG. 15 illustrates operations of the repair unit determiner 223 according to the example illustrated in FIG. 14.

Referring to FIG. 15, reference numeral '15a' denotes outputs of the repair unit determiner 223 when the first mode signal MD1 is deactivated, and reference numeral '15b' denotes outputs of the repair unit determiner 223 when the first mode signal MD1 is activated. For example, the first repair unit may be two bit lines, and the second repair unit may be four bit lines. Hereinafter, operations of the repair unit determiner 223 according to the embodiment will be described below with reference to FIGS. 13 to 15.

The repair unit determiner 223 may output a first defect column address FCA1 when the first mode signal MD1 is deactivated. In this exemplary embodiment, the first defect column address FCA1 may be generated by processing the least significant bit of the column address, e.g., CA0 as a don't-care bit, and accordingly, the first and second bit lines BL0 and BL1 may correspond to a defect column. Therefore, as illustrated in '14a' of FIG. 14, the first and second bit lines BL0 and BL1 may be replaced with the first and second redundancy bit lines RBL0 and RBL1.

The repair unit determiner 223 may output a second defect column address FCA2 when the first mode signal MD1 is activated. In this exemplary embodiment, the second defect column address FCA2 may be generated by processing the least significant bit of the column address, e.g., CA0, and a second least significant bit, e.g., CA1 as don't-care bits, and accordingly, the first to fourth bit lines BL0 to BL3 may correspond to the defect column. Therefore, as shown in '14b' of FIG. 14, it may be regarded that the first to fourth bit lines BL0 to BL3 may be replaced with the first to fourth redundancy bit lines RBL0 to RBL3.

As described above with reference to FIGS. 14 and 15, according to the embodiment, when the defect cell occurs as a result of the first test, the repair operation is performed on the defect cell according to the first repair unit, and when the repair operation is completed and the first mode signal is activated, the repair unit may be switched from the first repair unit to the second repair unit. As described above, according to the embodiment, by variably determining the repair unit, a post-test may be performed without correcting the test algorithm or changing the test sequences, and accordingly, test efficiency may be improved. In more detail, according to the embodiment, even when some of the columns are replaced with the redundancy columns according to the repair operation, influences of the columns on which the repair operation is not performed on the columns on which the repair operation is performed may be tested without correcting the test algorithm or changing the test sequences during the second test step.

Figure 16:
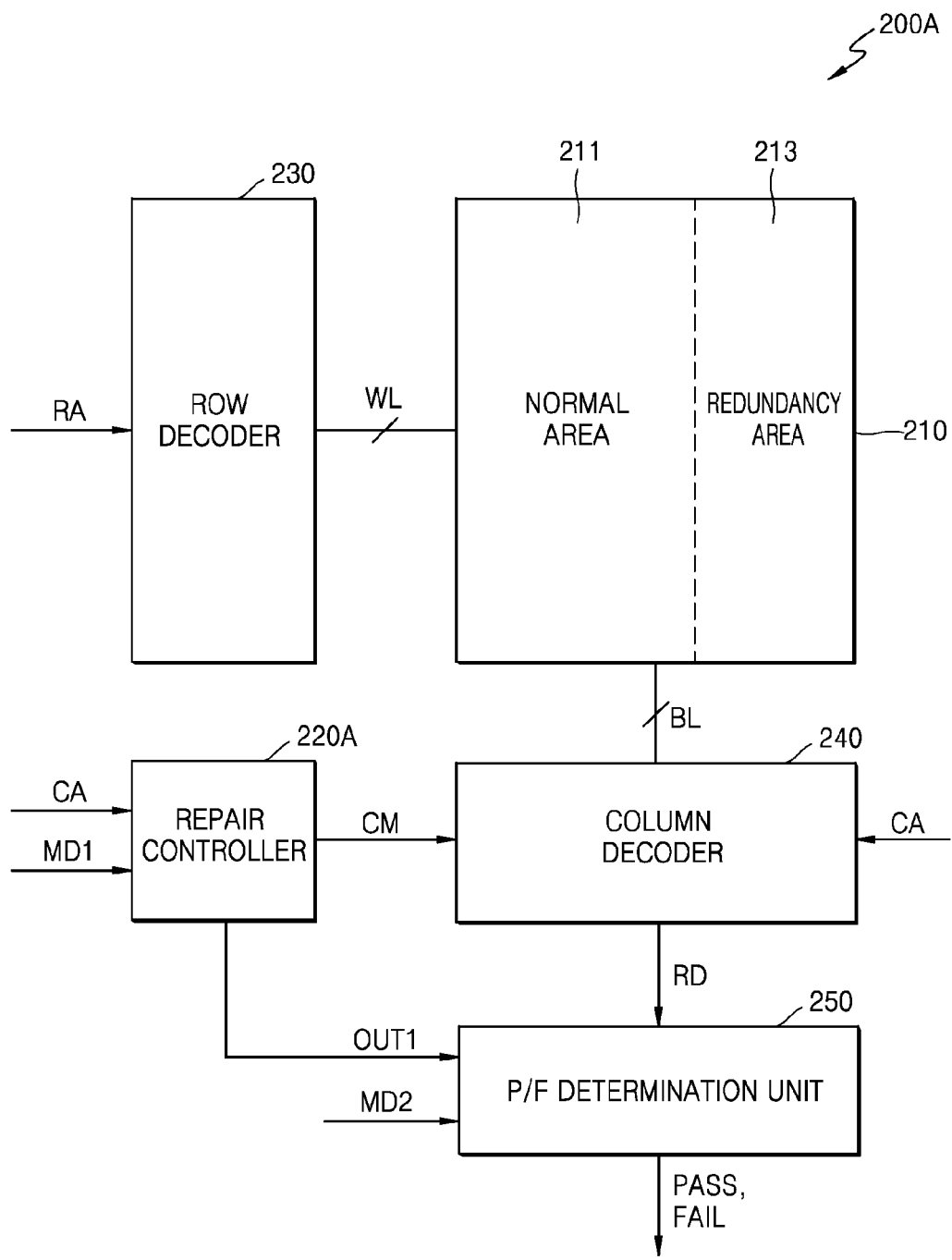
FIG. 16 is a block diagram of a memory device according to an exemplary embodiment.

FIG. 16 is a block diagram of a memory device 200A according to an exemplary embodiment.

Referring to FIG. 16, the memory device 200A may include the memory cell array 210, a repair controller 220A, the row decoder 230, the column decoder 240, and a pass/fail determiner 250. The memory device 200A of the embodiment is obtained by modifying the memory device 200 of FIG. 12, and may further include the pass/fail determiner 250 when comparing with the memory device 200 of FIG. 12. Descriptions provided above with reference to FIGS. 12 to 15 may be applied to the embodiment illustrated in FIG. 16, and descriptions same as the above will be omitted.

The repair controller 220A may control the repair operation on a defect cell from among the plurality of memory cells according to the first repair unit, and may switch the repair unit from the first repair unit to the second repair unit when the repair operation is completed. Also, the repair controller 220A may output a first output signal OUT1 representing information about memory cells that have not been repaired during the repair operation according to the first repair unit, but have been virtually repaired according to the second repair unit (e.g., memory cells connected to the third and fourth bit lines BL2 and BL3 of FIG. 14).

The repair controller 220A according to the embodiment may be similar to the repair controller 220 of FIG. 13, and descriptions provided with reference to FIG. 13 may be similarly applied to the embodiment illustrated in FIG. 16. In more detail, the repair controller 220A may further include a virtual repair detector, when comparing with the repair controller 220 of FIG. 13.

In this exemplary embodiment, the pass/fail determiner 250 may output a pass signal PASS or a fail signal FAIL, after determining whether the memory cell array 110 has passed the test based on the first output signal OUT1 transmitted from the repair controller 220A and the second mode signal MD2 transmitted from outside. The second mode signal MD2 may be deactivated during the first test step, and may be activated during the second test step. For example, the second mode signal MD2 may be transmitted from a test device or a memory controller (not shown).

When the second mode signal MD2 is deactivated, the pass/fail determiner 250 may perform a general pass/fail determination operation. In detail, the pass/fail determiner 250 may compare data RD read from the memory cell array 210 and data written on the memory cell array 210 with each other, so as to perform the general pass/fail determination operation on the memory cells of the memory cell array 210.

In addition, when the second mode signal MD2 is activated, the pass/fail determiner 250 may perform a pass/fail determination operation according to the first output signal OUT1. In detail, the pass/fail determiner 250 may output the pass signal PASS as a default with respect to the memory cells that have been virtually repaired according to the second repair unit, based on the first output signal OUT1. However, one or more embodiments are not limited thereto, that is, the pass/fail determiner 250 may output the fail signal FAIL as a default with respect to the memory cells that have been virtually repaired according to the second repair unit, based on the first output signal OUT1.

For example, although the third and fourth bit lines BL2 and BL3 of FIG. 14 have not been actually repaired during the repair operation, it is regarded that the third and fourth bit line BL2 and BL3 are repaired according to the second repair unit during the second test step and then the second test may be performed. In this exemplary embodiment, it may be determined that the memory cells connected to the third and fourth bit lines BL2 and BL3 have passed the test without regard to the read data RD, and then, the pass signal PASS may be output. Accordingly, errors of the test performed on the memory cells that have not been repaired by the repair operation, but have been virtually repaired may be prevented.

The pass/fail determiner 250 according to this exemplary embodiment may be similar to the pass/fail determiner 150 illustrated with reference to FIG. 11, and descriptions with reference to FIG. 11 may be applied to the pass/fail determiner 250 of FIG. 16. For example, the pass/fail determiner 250 may be configured to include a logic gate performing a logical operation on the first output signal OUT1 and the second mode signal MD2 to generate a second output signal, and a pass/fail check logic performing the pass/fail checking operation based on the second output signal and the read data RD.

Figure 17:
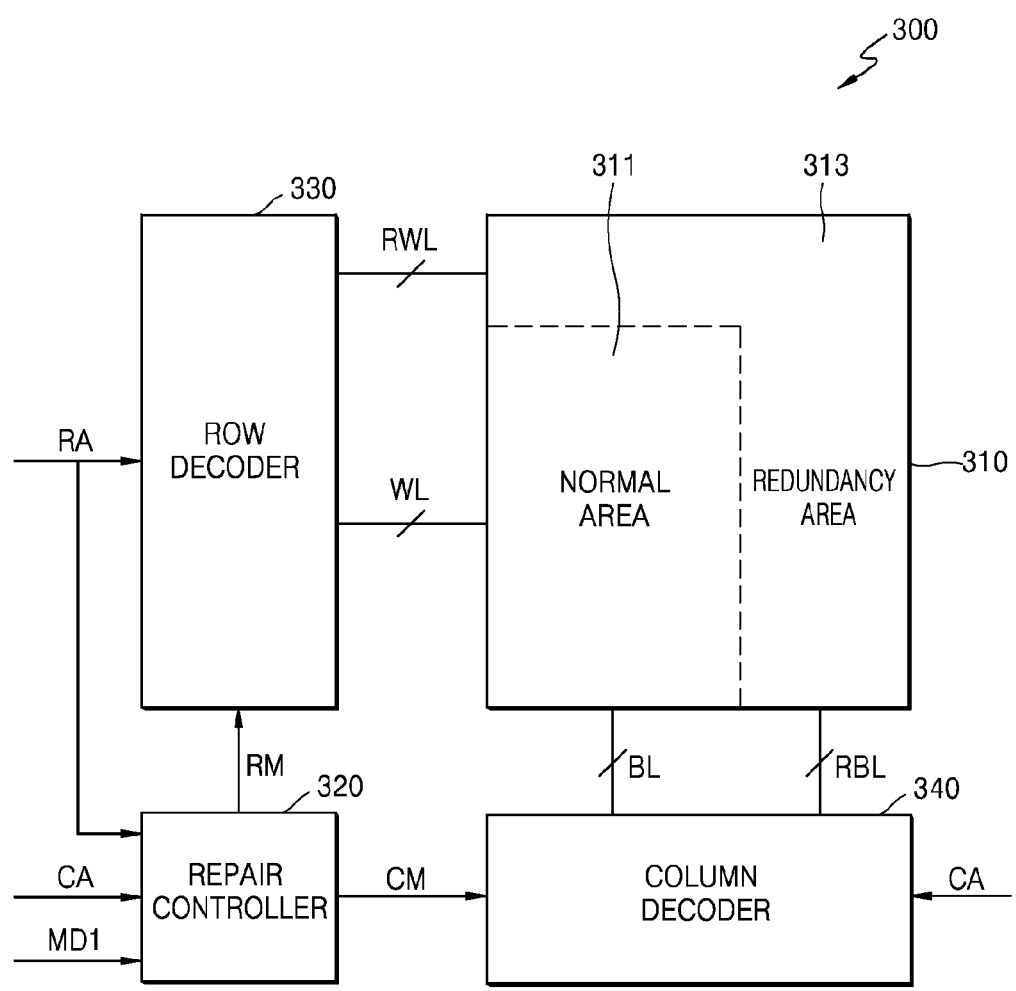
FIG. 17 is a block diagram of a memory device according to an exemplary embodiment.

FIG. 17 is a block diagram of a memory device 300 according to an exemplary embodiment.

Referring to FIG. 17, the memory device 300 may include a memory cell array 310, a repair controller 320, a row decoder 330, and a column decoder 340. The memory device 300 of the embodiment is obtained by modifying the memory device 100 of FIG. 1, and descriptions provided above with reference to FIG. 1 will be omitted.

The memory cell array 310 may include a normal area 311 in which a plurality of memory cells are arranged, and a redundancy area 313 in which a plurality of redundancy memory cells are arranged. In one embodiment, the redundancy area 313 may be adjacent to the normal area 311 along a direction in which word lines WL extend and a direction in which bit lines BL extend. In more detail, the normal area 311 may include a plurality of memory cells respectively arranged on regions where a plurality of word lines WL and a plurality of bit lines BL intersect each other, and the redundancy area 313 may include a plurality of redundancy memory cells that are respectively arranged on regions where the plurality of word lines WL and a plurality of redundancy bit lines RBL intersect each other, regions where a plurality of redundancy word lines RWL and a plurality of bit lines BL intersect each other, and regions where the plurality of redundancy word lines RWL and a plurality of redundancy bit lines RBL intersect each other.

At least one of the memory cells arranged in the normal area 311 may have a defect, and a defect cell occurring in the normal area 311 may be replaced with a redundancy memory cell included in the redundancy area 313 by a repair operation. According to the repair operation, data to be written on or read from the defect cell may be written on or read from the redundancy memory cell.

In this exemplary embodiment, the repair operation may be performed according to a memory cell repairing method, in which the defect cell of the normal area 311 is replaced with the redundancy memory cell of the redundancy area 313. In one embodiment, the repair unit may be a memory cell, and accordingly, the defect cell may be replaced with the redundancy memory cell. In one embodiment, the repair unit may be a memory cell group, and accordingly, a memory cell group including the defect cell may be replaced with a redundancy memory cell group. For example, the memory cell group may correspond to a plurality of memory cells that are adjacent to each other in a bit line direction. As another example, the memory cell group may correspond to a plurality of memory cells that are adjacent to each other in a bit line direction and a word line direction.

The repair controller 320 may control the repair operation on a defect cell from among the plurality of memory cells, according to a first repair unit. In detail, the repair controller 320 may control the repair operation according to the first repair unit, if an input address of a memory cell that is to be accessed corresponds to the defect cell. In more detail, the repair controller 320 may generate a column matching signal CM when the column address CA corresponds to the defect cell, and may provide the column matching signal CM to the column decoder 340. Accordingly, the column decoder 340 may activate redundancy bit lines RBL according to the first repair unit, in response to the column matching signal CM. In addition, the repair controller 320 may generate a row matching signal RM when the row address RA corresponds to the defect cell, and may provide the row matching signal RM to the row decoder 330. Accordingly, the row decoder 330 may activate redundancy word lines RWL according to the first repair unit, in response to the row matching signal RM.

In addition, when the repair operation is finished, the repair controller 320 may switch the repair unit from the first repair unit to the second repair unit. In one embodiment, the repair controller 320 may switch the first repair unit to the second repair unit in response to the first mode signal MD1 transmitted from the outside. For example, the first repair unit may be n memory cells, wherein n may be a natural number. In addition, for example, the second repair unit may be m memory cells, wherein m may be a natural number greater than n.

The row decoder 330 may select some of the plurality of word lines WL in response to the row address RA, and may activate selected word lines WL. In addition, the row decoder 330 may select some of the plurality of redundancy word lines RWL in response to the row matching signal RM, and may activate selected redundancy word lines RWL. In detail, the row decoder 330 may disable the row address RA and activate the redundancy word lines RWL, in response to the row matching signal RM.

The column decoder 340 may select some of the plurality of bit lines BL in response to the column address CA, and activate selected bit lines. In addition, the column decoder 340 may select some of the plurality of redundancy bit lines RBL in response to the column matching signal CM, and activate selected redundancy bit lines RBL. In more detail, the column decoder 340 may disable the column address CA and activate the redundancy bit lines, in response to the column matching signal CM.

Figure 18:
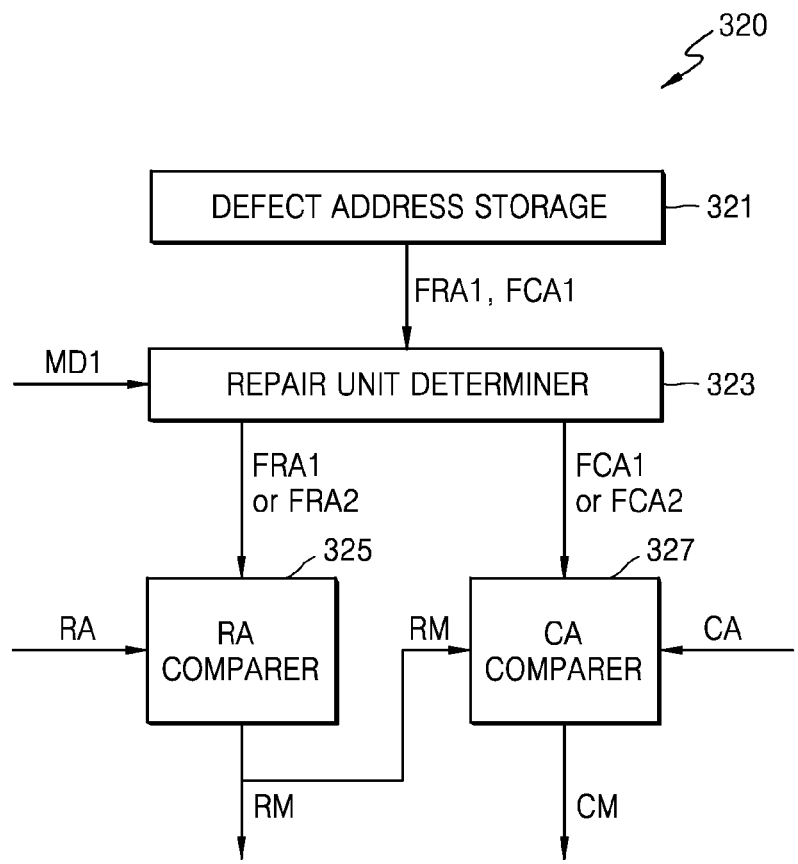
FIG. 18 is a block diagram of a repair controller of FIG. 17 according to an exemplary embodiment.

FIG. 18 is a block diagram of the repair controller 320 of FIG. 17, according to an exemplary embodiment.

Referring to FIG. 18, the repair controller 320 may include a defect address storage 321, a repair unit determiner 323, a row address comparer 325, and a column address comparer 327. In FIG. 18, the defect address storage 321 is included in the repair controller 320 of the memory device 300, but is not limited thereto. For example, in one embodiment, the defect address storage 321 may be separately provided from the repair controller 320 in the memory device 300. In another embodiment, the defect address storage 321 may be provided on an outer portion of the memory device 300, for example, may be included in a memory controller or a test device. Hereinafter, configurations and operations of the repair controller 320 will be described below with reference to FIGS. 17 and 18.

The defect address storage 321 stores location information of at least one defect cell occurring in the normal area 311 of the memory cell array 310, that is, address information (hereinafter, referred to as 'first defect address'). In one embodiment, the location information of the defect cell may be row address information of the defect cell, that is, a first defect row address FRA1, and column address information of the defect cell, that is, a first column address FCA1.

The defect address storage 321 may include non-volatile memory devices so as to store the first defect row address FRA1 and the first defect column address FCA1. For example, the defect address storage 321 may include anti-fuses AF so as to store the first defect row address FRA1 and the first defect column address FCA1. Descriptions provided above with reference to FIGS. 3 and 4 may be applied to the embodiment illustrated with reference to FIGS. 17 and 18.

The repair unit determiner 323 may determine the first repair unit or the second repair unit as the repair unit, in response to the first mode signal MD1 transmitted from outside. In detail, the repair unit determiner 323 may output the first defect row address FRA1 and the first defect column address FCA1 when the first mode signal MD1 is deactivated. The repair unit determiner 323 processes some bits in the first defect row address FRA1 as don't-care bits according to the first mode signal so as to output a second defect row address FRA2, and processes some bits in the first defect column address FCA1 as don't-care bits according to the first mode signal so as to output a second defect column address FCA2, when the first mode signal MD1 is activated.

The row address comparer 325 may compare the first defect row address FRA1 or the second defect row address FRA2 with the input row address RA. In detail, when the first mode signal MD1 is deactivated, the row address comparer 235 compares the first defect row address FRA1 with the input row address RA, and when the first defect row address FRA1 is equal to the input row address RA as a comparison result, the row address comparer 325 may output a row matching signal RM. When the first mode signal MD1 is activated, the row address comparer 325 compares the second defect row address FRA2 with the input row address RA, and when the second defect row address FRA2 is equal to the input row address RA as a comparison result, the row address comparer 325 may output a row matching signal RM.

The column address comparer 327 may compare the first defect column address FCA1 or the second defect column address FCA2 with the input column address CA. In one embodiment, the column address comparer 327 may be activated in response to the row matching signal RM. In detail, the column address comparer 327 does not perform the column address comparing operation when the row matching signal RM is deactivated, and performs the column address comparing operation when the row matching signal RM is activated.

In more detail, when the first mode signal MD1 is deactivated, the column address comparer 327 compares the first defect column address FCA1 with the input column address CA, and when the first defect column address FCA1 is equal to the input column address CA as a comparison result, the column address comparer 327 outputs a column matching signal CM. When the first mode signal MD1 is activated, the column address comparer 327 compares the second defect column address FCA2 with the input column address CA, and when the second defect column address FCA2 is equal to the input column address CA as a comparison result, the column address comparer 327 outputs the column matching signal CM.

According to this exemplary embodiment, when a defect cell occurs as a result of the first test, the repair operation is performed on the defect cell according to the first repair unit, and when the repair operation is completed and the first mode signal MD1 is activated, the repair unit may be switched from the first repair unit to the second repair unit. As described above, by variably determining the repair unit, a successive test may be performed without correcting the test algorithm or changing the test sequences in the successive test step, and accordingly, test efficiency may be improved. In more detail, according to the embodiment, even when some memory cells are replaced with redundancy memory cells by the repair operation, influences of the memory cells that are not repaired during the repair operation on the memory cells that have been repaired by the repair operation may be tested without correcting the test algorithm or changing the test sequences in a second test step.

Figure 19:
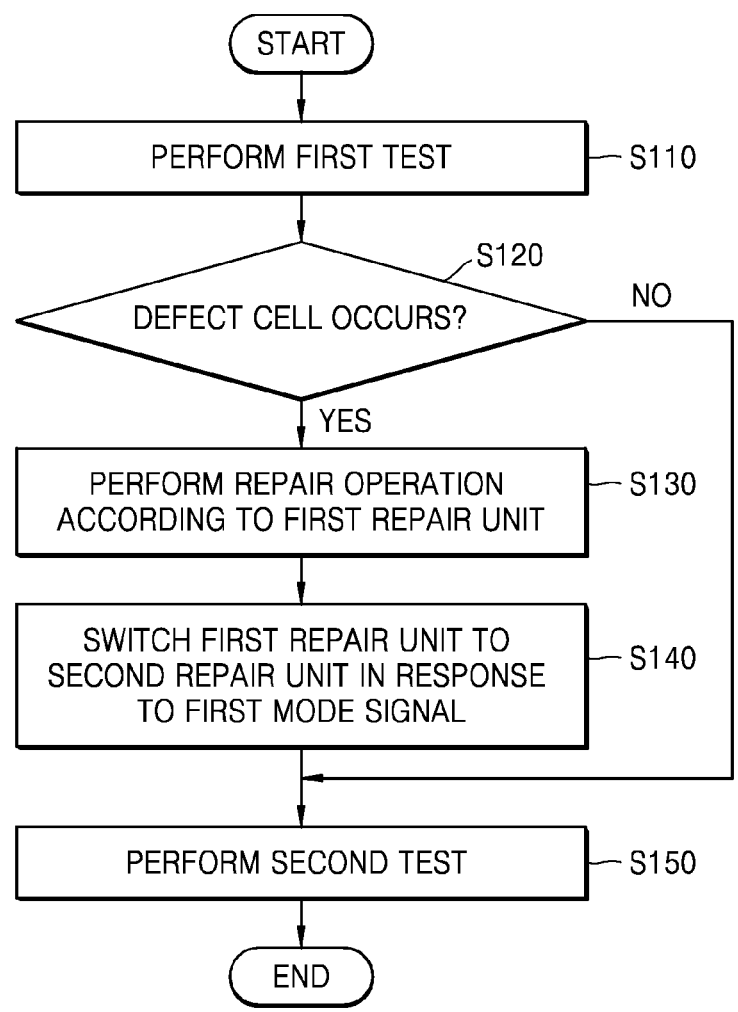
FIG. 19 is a flow chart illustrating a method of testing a memory device, according to an exemplary embodiment.

FIG. 19 is a flowchart illustrating a method of testing a memory device, according to an exemplary embodiment.

Referring to FIG. 19, the method of testing the memory device according to the embodiment may include a plurality of test steps, and may correspond to, for example, the method of testing the memory device 100, 100A, 200, 200A, or 300 illustrated with reference to FIG. 1, 9, 12, 16, or 17. Descriptions provided above with reference to FIGS. 1 to 18 may be also applied to the method illustrated with reference to FIG. 19.

In operation S110, a first test is performed on the memory device. In one embodiment, the first test may be a wafer level test. In another embodiment, the first test may be a post-package test.

In operation S120, it is determined whether a defect cell occurs in the memory device 100, 100A, 200, 200A, or 300. In more detail, it may be determined whether the defect cell occurs in a normal area of a memory cell array in the memory device. As a result of determination, if the defect cell occurs, operation S130 is executed, and if the defect cell does not occur, operation S150 is executed.

In operation S130, a repair operation is performed according to a first repair unit. In one embodiment, the first repair unit may be a row unit, and a row including the defect cell may be replaced with a redundancy row by the repair operation. In one embodiment, the first repair unit may be a column unit, and a column including the defect cell may be replaced with a redundancy column by the repair operation. In one embodiment, the first repair unit may be a memory cell unit, and the defect cell may be replaced with a redundancy memory cell by the repair operation.

Figure 20:
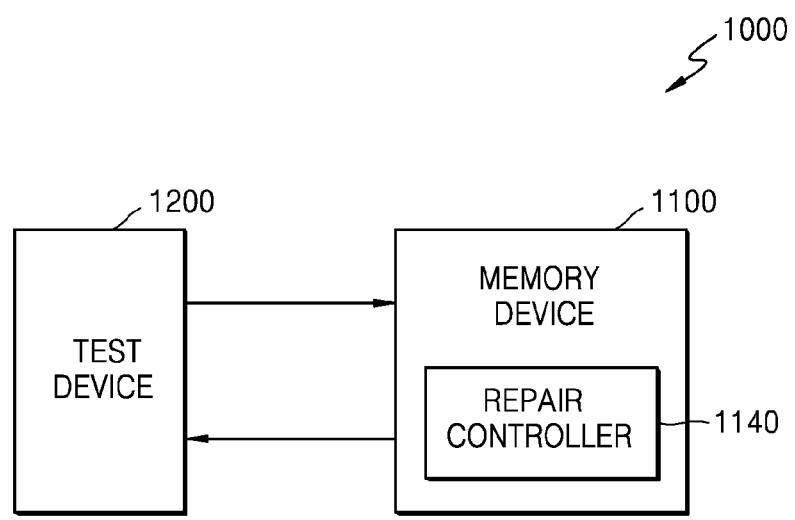
FIG. 20 is a block diagram of a test system according to an exemplary embodiment.

In operation S140, the first repair unit is switched to a second repair unit in response to a first mode signal. In this exemplary embodiment, the first mode signal may be transmitted from outside, e.g., a test device (e.g., a test device 1200 as shown in FIG. 20) or a memory controller. In one embodiment, the first repair unit may be n word lines, and the second repair unit may be m word lines. In one embodiment, the first repair unit may be n bit lines, and the second repair unit may be m bit lines. In one embodiment, the first repair unit may be n memory cells, and the second repair unit may be m memory cells. In this exemplary embodiment, m and n are natural numbers, and m may be greater than n.

In operation S150, a second test is performed on the memory device 100, 100A, 200, 200A, or 300. In one embodiment, the second test may be a wafer level test, and in another embodiment, the second test may be a post-package test.

FIG. 20 is a block diagram of a test system 1000 according to an embodiment.

Referring to FIG. 20, the test system 1000 may include a memory device 1100 and a test device 1200. In this exemplary embodiment, the memory device 1100 may be referred to as a device under test (DUT). The memory device 1100 may correspond to the memory device 100, 100A, 200, 200A, or 300 illustrated with reference to FIG. 1, 9, 12, 16, or 17. However, one or more embodiments are not limited thereto, and the memory device 1100 may be a memory module.

The test device 1200 may transfer a command for executing a test operation to the memory device 1100. In one embodiment, the test device 1200 may transfer test data and test mode register set (TMRS) information to the memory device 1100.

The memory device 1100 may perform the test operation according to the command. In one embodiment, the memory device 1100 may detect an error from data that is read according to the TMRS information. In one embodiment, the memory device 1100 may include a repair controller 1140, and the repair controller 1140 may perform a redundancy repair operation on a defect cell. For example, the repair controller 1140 may be implemented as the repair controller 120, 120A, 220, 220A, or 320 illustrated with reference to FIG. 1, 9, 12, 16, or 17. In addition, the memory device 1100 may further include an error correction code (ECC) engine, and may correct a detected error and transmit corrected data to the test device 1200.

Figure 21:
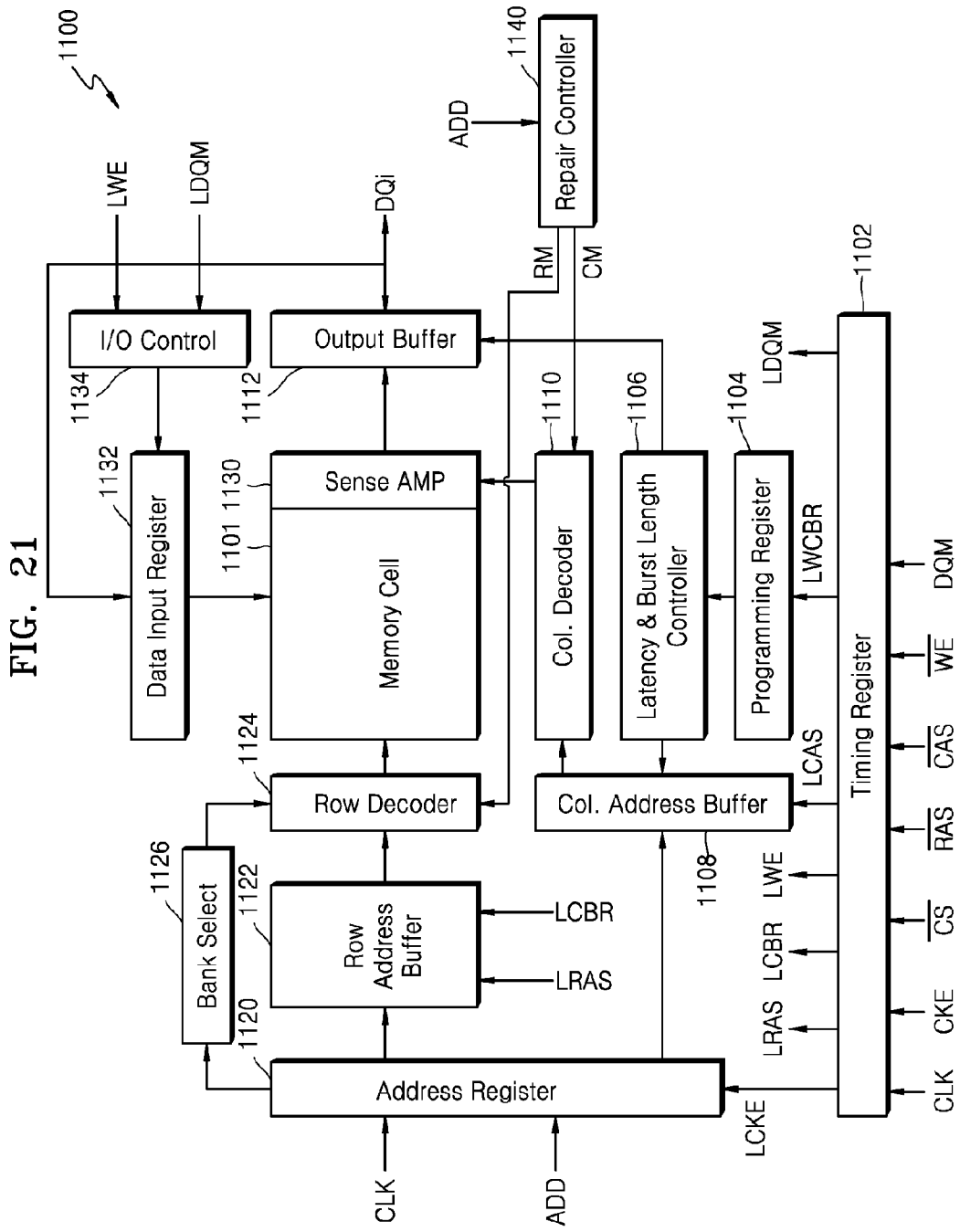
FIG. 21 is a block diagram of a memory device in detail, according to an exemplary embodiment.

FIG. 21 is a block diagram of the memory device 1100 in detail according to an exemplary embodiment. Referring to FIG. 21, the memory device 1100 may include various circuit blocks for driving a memory cell array 1101 according to one or more embodiments. The memory cell array 1101 may include DRAM cells.

A timing register 1102 may be activated when a chip selection signal CS is switched from a deactivation level (e.g., logic high) to an activation level (e.g., logic low). The timing register 1102 receives command signals such as a clock signal CLK, a clock enable signal CKE, a chip selection signal CSB, a row address strobe signal RASB, a column address strobe signal CASB, a write enable signal WEB, and a data input/output mask signal DQM from outside, and processes the command signals to generate various internal command signals such as LRAS, LCBR, LWE, LCAS, LWCBR, and LDQM for controlling the circuit blocks.

Some of the internal command signals generated by the timing register 1102 are stored in a programming register 1104. For example, latency information or burst length information related to data output may be stored in the programming register 1104. The internal command signals stored in the programming register 1104 may be provided to a latency/burst length controller 1106, and the latency/burst length controller 1106 may provide a control signal for controlling the latency or the burst length of data output to a column decoder 1110 or an output buffer 1112 via a column address buffer 1108.

An address register 1120 may receive an address signal ADD from outside. A row address signal may be provided to a row decoder 1124 via a row address buffer 1122. In addition, a column address signal may be provided to the column decoder 1110 via the column address buffer 1108. The row address buffer 1122 may further receive a refresh address signal generated by a refresh counter in response to refresh commands LRAS and LCBR, and may provide one of the row address signal and the refresh address signal to the row decoder 1124. In addition, the address register 1120 may provide a bank signal for selecting a bank to a bank selector 1126.

The row decoder 1124 decodes the row address signal or the refresh address signal input from the row address buffer 1122, and may activate word lines of the memory cell array 1101. The column decoder 1110 may decode the column address signal, and perform an operation for selecting a bit line in the memory cell array 1101. For example, a column selection line may be applied to the memory device 1100 so that a selection operation may be performed via the column selection line.

A sense amplifier 1130 amplifies data of a memory cell selected by the row decoder 1124 and the column decoder 1110, and may provide amplified data to an output buffer 1112. Data to be written on a data cell is provided to the memory cell array 1101 via a data input register 1132, and an input/output controller 1134 may control a data transfer operation via the data input register 1132.

The repair controller 1140 compares the address signal ADD with a defect address, and when the address signal ADD is equal to the defect address, the repair controller 1140 may generate a row matching signal RM or a column matching signal CM. The row decoder 1124 may perform a repair operation in response to the row matching signal RM, and the column decoder 1110 may perform a repair operation in response to the column matching signal CM. The repair controller 1140 may perform the repair operation in a row unit, a column unit, or a memory cell unit.

When the repair operation is completed, the repair controller 1140 may switch the repair unit from the first repair unit to the second repair unit. In one embodiment, the repair controller 1140 may switch the first repair unit to the second repair unit in response to a first mode signal transmitted from outside. In one embodiment, the first repair unit may be n word lines, and the second repair unit may be m word lines. In one embodiment, the first repair unit may be n bit lines, and the second repair unit may be m bit lines. In one embodiment, the first repair unit may be n memory cells, and the second repair unit may be m memory cells. In this exemplary embodiment, m and n are natural numbers, and m may be greater than n.

Figure 22A:
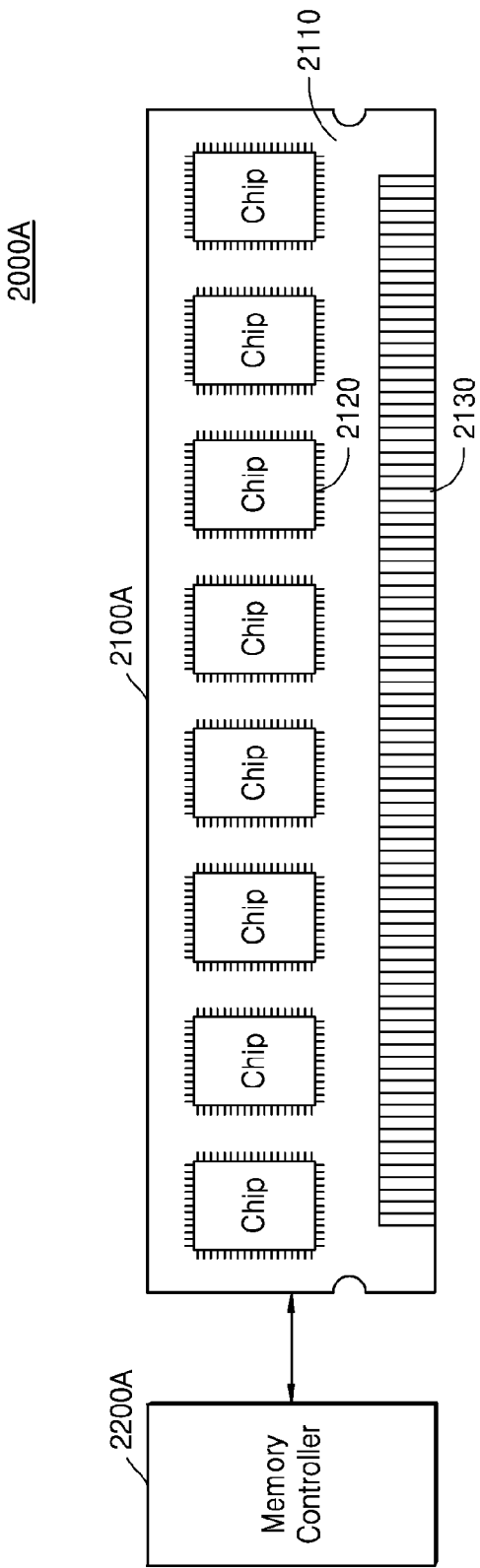
FIGS. 22A and 22B are block diagrams of a memory system according to an exemplary embodiment.
Figure 22B:
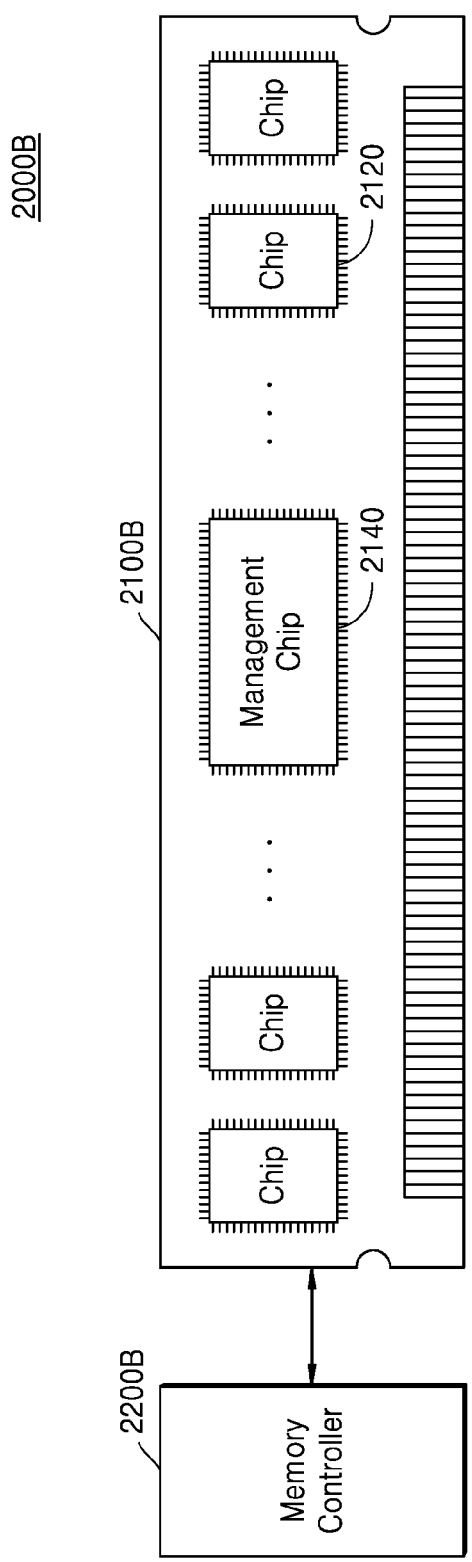

FIGS. 22A and 22B are block diagrams of memory systems 2000A and 2000B according to one or more embodiments.

Referring to FIG. 22A, the memory system 2000A includes a memory module 2100A and a memory controller 2200A. The memory module 2100A includes a printed circuit board (PCB) 2110, a plurality of memory chips 2120, and a connector 2130. The plurality of memory chips 2120 may be coupled to upper and lower surfaces of the PCB 2110. The connector 2130 is electrically connected to the plurality of memory chips 2120 via conductive lines. In addition, the connector 2130 may be connected to a slot of an external host.

The plurality of memory chips 2120 may include volatile memories such as DRAM cells or non-volatile memories such as STT-MRAM cells. In this exemplary embodiment, the memory chips 2120 may shortly or temporarily store data of a computer system such as an operating memory or a cache memory. The plurality of memory chips 2120 may perform the repair operation illustrated with reference to the previous embodiments. For example, each of the plurality of memory chips 2120 may include a repair controller, and the repair controller controls a repair operation on a defect cell according to a first repair unit and switches the repair unit from the first repair unit to a second repair unit when the repair operation is finished.

The memory controller 2200A may perform an operation of detecting a defect of an address corresponding to a command, in parallel with an operation of queuing the command or outputting the command. In the memory system, a DRAM interface may be applied between the memory controller 2200A and the memory module 2100A. In the memory system 2000A of FIG. 22A, the memory controller 2200A is separately provided from the memory module 2100A, but the memory controller 220A may be included in the memory module 2100A. The memory controller 2200A may be coupled to the upper or lower surface of the PCB 2110, and may communicate with the memory chips 2120 via the conductive lines.

As shown in FIG. 22B, a memory system 2000B includes a memory module 2100B and a memory controller 2200B, and the memory module 2100B may include one or more semiconductor chips, each including a cell array, and a management chip 2140 for managing a memory operation on the cell array. Some functions of the memory controller 2200B may be performed by the management chip 2140.

Some of the components and operations performed for the repair operation in the previous embodiments may be performed by the management chip 2140. For example, address information regarding the defect cell may be stored in the management chip 2140, and accordingly, row/column addresses for activating a redundancy cell may be provided from the management chip 2140 to the plurality of memory chips 2120.

In FIG. 22B, some functions of the memory controller is performed by a memory module of a load reduced dual-inline memory module (LRDIMM) type, but one or more embodiments are not limited thereto. For example, a memory module of a fully buffered DIMM (FBDIMM) type is applied, and accordingly, an advanced memory buffer (AMB) chip may be mounted in the memory module as a management chip. Otherwise, a memory module of another type may be applied, and at least some of the functions of the memory controller may be implemented to be performed by the memory module.

Figure 23:
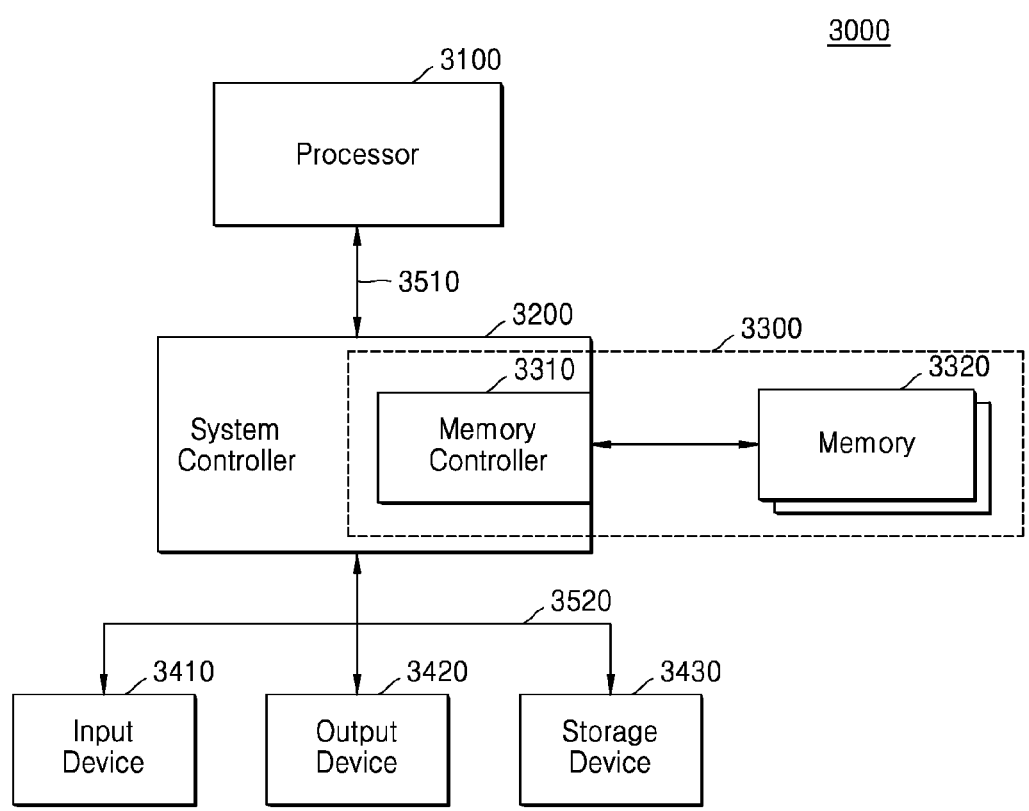
FIG. 23 is a block diagram of a computer system according to an exemplary embodiment.

FIG. 23 is a block diagram of a computer system 3000 according to an embodiment.

Referring to FIG. 23, the computer system 3000 includes a processor 3100, a system controller 3200, and a memory system 3300. The computer system 3000 may further include a processor bus 3510, an expansion bus 3520, an input device 3410, an output device 3420, and a storage device 3430. The computer system 3000 may be a desk top computer, a laptop computer, a workstation, a handheld device, etc.

The processor 3100 may execute various computing system, e.g., executing certain software for executing certain computations or tasks. For example, the processor 3100 may be a microprocessor or a central processor unit. The processor 3100 may be connected to the system controller 3200 via the processor bus 3510 including an address bus, a control bus, and/or a data bus. The system controller 3200 may be connected to the expansion bus 3520 such as a peripheral component interconnection (PCI) bus. Accordingly, the processor 3100 may control one or more input devices 3410 such as a keyboard or a mouse, one or more output devices 3420 such as a printer or a display device, or one or more storage devices 3430 such as a hard disk drive, a solid state drive, or a CD-ROM, via the system controller 3200.

The memory system 3300 includes at least one semiconductor memory device 3320 and a memory controller 3310. The memory controller 3310 may be included in the system controller 3200. The memory controller 3310 may control the at least one semiconductor memory device 3320 to execute the command provided by the processor 3100. The at least one semiconductor memory device 3320 may store data provided from the memory controller 3310, and provide stored data to the memory controller 3310. The semiconductor memory device 3320 converts data provided from the memory controller 3310 to generate cell data, and store the cell data in memory cells. In addition, the at least one semiconductor memory device 3320 read the cell data from the memory cells, and converts the cell data and provides converted data to the memory controller 3310. The at least one semiconductor memory device 3320 may include a plurality of memory chips, e.g., DRAMs, SRAMs, or non-volatile memory chips.

While the disclosure has been particularly shown and described with reference to embodiments thereof, it will be understood that various changes in form and details may be made therein without departing from the spirit and scope of the following claims.

What is claimed is:

1. A memory device comprising:
a memory cell array including a normal area in which a plurality of memory cells are arranged, and a redundancy area in which a plurality of redundancy memory cells are arranged; and
a repair controller configured to control a repair operation on a defect cell from among the plurality of memory cells according to a first repair unit, and switch a repair unit from the first repair unit to a second repair unit different from the first repair unit when the repair operation based on the first repair unit is completed,
wherein the repair controller comprises a repair unit determiner circuit configured to determine the first repair unit or the second repair unit as the repair unit, in response to a first mode signal transmitted from outside of the memory device, and
wherein the repair unit determiner circuit is configured to process some bits in a first defect address representing an address of the defect cell as don't-care bits according to the first mode signal so as to output a second defect address according to the second repair unit.

2. The memory device of claim 1, wherein the repair controller further comprises a comparer circuit configured to compare an input address with the second defect address to output a matching signal.

3. The memory device of claim 2, wherein the first repair unit is n word lines and the second repair unit is m word lines, wherein n is a natural number and m is a natural number greater than n, and
the comparer circuit is configured to compare a first defect row address according to the first repair unit or a second defect row address according to the second repair unit with an input row address to output a row matching signal.

4. The memory device of claim 2, wherein the first repair unit is n bit lines and the second repair unit is m bit lines, wherein n is a natural number and m is a natural number greater than n, and
the comparer circuit is configured to compare a first defect column address according to the first repair unit or a second defect column address according to the second repair unit with an input column address to output a column matching signal.

5. The memory device of claim 2, wherein the first repair unit is n memory cells and the second repair unit is m memory cells, wherein n is a natural number and m is a natural number greater than n, and
the comparer circuit is configured to compare a first defect row address according to the first repair unit or a second defect row address according to the second repair unit with an input row address in order to output a row matching signal, and compare a first defect column address according to the first repair unit or a second defect column address according to the second repair unit with an input column address in order to output a column matching signal.

6. The memory device of claim 1, wherein the repair controller further comprises a virtual repair detector circuit configured to generate a first output signal representing whether a virtual repair operation has been performed according to the second repair unit, based on the first and second defect addresses.

7. The memory device of claim 6, further comprising a pass/fail determiner circuit configured to determine whether the memory cell array has passed a test to output a pass signal or a fail signal, based on the first output signal and a second mode signal transmitted from outside of the memory device.

8. The memory device of claim 7, wherein the pass/fail determiner circuit comprises:
   a logic gate configured to perform a logical operation on the first output signal and the second mode signal to generate a second output signal; and
   a pass/fail check logic configured to output the pass signal or the fail signal with respect to the memory cell array, based on a read result transmitted from the memory cell array and the second output signal.

9. The memory device of claim 8, wherein the first and second mode signals are signals transmitted from a test device.

10. The memory device of claim 8, wherein the first and second mode signals are activated in a post-package test operation with respect to the memory device.

11. The memory device of claim 1, wherein the repair controller further comprises a defect address storage configured to store the first defect address.

12. The memory device of claim 1, wherein the plurality of memory cells are volatile memory cells.

13. A memory device comprising:
   a memory cell array comprising a normal area in which a plurality of memory cells are arranged, and a redundancy area in which a plurality of redundancy memory cells are arranged; and
   a repair controller configured to:
   receive a first mode signal transmitted from outside of the memory device;
   perform, when the first mode signal is deactivated, a repair operation on a defect cell from among the plurality of memory cells according to a first repair unit; and
   switch a repair unit from the first repair unit to a second repair unit different from the first repair unit when the first mode signal is activated and the repair operation based on the first repair unit is completed,
   wherein the repair controller further comprises a repair unit determiner circuit configured to process some bits in a first defect address representing an address of the defect cell as don't-care bits according to the first mode signal so as to output a second defect address according to the second repair unit.

14. The memory device of claim 13, wherein the first repair unit is n memory cells and the second repair unit is m memory cells, wherein n is a natural number and m is a natural number greater than n, and
   wherein the repair controller comprises a comparer circuit configured to:
   compare a first defect row address according to the first repair unit or a second defect row address according to the second repair unit with an input row address in order to output a row matching signal, and
   compare a first defect column address according to the first repair unit or a second defect column address according to the second repair unit with an input column address in order to output a column matching signal.

15. The memory device of claim 14, wherein the repair controller further comprises a virtual repair detector circuit configured to generate a first output signal representing whether a virtual repair operation has been performed according to the second repair unit, based on the first and second defect addresses.

16. The memory device of claim 15, further comprising a pass/fail determiner circuit configured to determine whether the memory cell array has passed a test to output a pass signal or a fail signal, based on the first output signal and a second mode signal transmitted from outside of the memory device.

17. A memory device comprising:
   a memory cell array comprising a normal area in which a plurality of memory cells are arranged, and a redundancy area in which a plurality of redundancy memory cells are arranged; and
   a repair controller configured to receive a first mode signal transmitted from outside of the memory device and perform a repair operation on a defect cell from among the plurality of memory cells according to a first repair unit when the first mode signal is deactivated, and switch a repair unit from the first repair unit to a second repair unit different from the first repair unit when both the repair operation based on the first repair unit is completed and the first mode signal is activated, so that a subsequent test is performed without correcting a test algorithm or changing test sequences,
   wherein the repair controller further comprises a repair unit determiner circuit configured to process some bits in a first defect address representing an address of the defect cell as don't-care bits according to the first mode signal so as to output a second defect address according to the second repair unit.

* * * * *